US010720852B1

United States Patent
Soles

(10) Patent No.: US 10,720,852 B1
(45) Date of Patent: Jul. 21, 2020

(54) HIGH POWER DIRECT CURRENT/ALTERNATING CURRENT INVERTER

(71) Applicant: U.S. GOVERNMENT AS REPRESENTED BY THE SECRETARY OF THE ARMY, Washington, DC (US)

(72) Inventor: Alexander M. Soles, Warren, MI (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/262,086

(22) Filed: Jan. 30, 2019

(51) Int. Cl.
| | | |
|---|---|---|
| *H02M 7/53* | (2006.01) |
| *H02M 7/00* | (2006.01) |
| *H02M 7/5387* | (2007.01) |
| *H02M 1/08* | (2006.01) |
| *B60R 16/02* | (2006.01) |
| *H05K 7/20* | (2006.01) |
| *H02M 1/44* | (2007.01) |

(52) U.S. Cl.
CPC .......... *H02M 7/003* (2013.01); *B60R 16/02* (2013.01); *H02M 1/08* (2013.01); *H02M 1/44* (2013.01); *H02M 7/5387* (2013.01); *H05K 7/20254* (2013.01); *H05K 7/20872* (2013.01); *H05K 7/20927* (2013.01)

(58) Field of Classification Search
CPC .................................................. H02M 7/003
See application file for complete search history.

(56) References Cited

U.S. PATENT DOCUMENTS

| | | | |
|---|---|---|---|
| 6,618,278 B2 | 9/2003 | Suzuki et al. | |
| 6,621,701 B2 | 9/2003 | Tamba et al. | |
| 9,241,428 B1 | 1/2016 | Doo et al. | |
| 2017/0112014 A1* | 4/2017 | Bialek | H02J 7/0045 |
| 2018/0062539 A1* | 3/2018 | Singh | H02M 1/08 |

(Continued)

OTHER PUBLICATIONS

Yin,Shan; Tseng, K.J.; Simanjorang, Rejeki; Tong, C.F.;Gupta,Amit; (Demonstration of a 50kW and 100kHz SiC High Power Density Converter for Aerospace Application, IEEE TENCON-Proceeding of the International Conference, Aug. 2016, pp. 2888-2891. (Year: 2016).*

(Continued)

*Primary Examiner* — Harry R Behm
(74) *Attorney, Agent, or Firm* — Rodney E. Haven

(57) ABSTRACT

One example is an inverter assembly for converting direct current (DC) to alternating current (AC). A DC connector on the inverter assembly is connected to an upper DC bus. A silicon carbide (SiC) heat sink is mounted above the upper DC bus and at least one capacitor is mounted above the SiC heat sink. A lower DC bus is connected to the upper DC bus and a liquid cooled cold-plate cooling unit is positioned between the upper and lower DC busses. SiC half-bridge units are located between the upper DC bus and the cold-plate and between the lower DC bus and the cold-plate. A gate driver unit is located on the upper DC bus above one converter heatsink and another driver located on the lower DC bus below the other converter heatsink. An AC output connector connects the converters to the AC output connecter.

12 Claims, 18 Drawing Sheets

(56) References Cited

U.S. PATENT DOCUMENTS

2018/0206359 A1* 7/2018 McPherson .......... H05K 7/1432

OTHER PUBLICATIONS

Zhang, Chi; Srdic,Srdjan; Lukic,Srdjan; Kang,Yonghan; Choi, Edward; Tafti, Ehsan; (A SiC-Based 100 kW High-Power-Density (34 kW/L) Electric Vehicle Traction Inverter), May 2018, IEEE, pp. 3880-3885. (Year: 2018).*

Yamaguchi, Koji; (Design and Evaluation of SiC-Based High Power Density Inverter, 70kW/liter,50kW/kg), IEEE, Feb. 2016; pp. 3075-3079 (Year: 2016).*

* cited by examiner

HIGH POWER DIRECT CURRENT/ALTERNATING CURRENT INVERTER

GOVERNMENT INTEREST

The inventions described herein may be made, used, and/or licensed by or for the U.S. Government for U.S. Government purposes.

TECHNICAL FIELD

A high power bi-directional direct current/alternating current (DC/AC) inverter utilizes a "flow-through" DC bus design that has minimal length and minimal turns/rotations to flow current from its input DC connector to its output AC connector with low power loss. The inverter uses silicon-carbide for high power applications as well as a unique cold-plate and converter power electronics cooling structure. In particular, the inverter relates generally to a flow-through bus utilizing silicon-carbide components that is compact in physical dimensions for high power, elevated temperature applications.

BACKGROUND

A power inverter, or inverter, is an electronic device and/or circuitry that changes direct current (DC) into alternating current (AC). Some inverters also have the capability of converting AC into DC, and vice versa. The input voltage, output voltage and frequency, and overall power handling depends, in part, on the design of the specific device/circuitry. The inverter does not produce power. Instead, the power is provided by an AC or a DC source. A power inverter are entirely electronic but historically have been a combination of mechanical effects (such as a rotary apparatus) and electronic circuitry. Static (electronic) inverters do not use moving parts in the conversion process. For example, digital signal processors (DSPs) can perform the functions of generating an AC signal that were once performed by mechanical devices.

SUMMARY

The following presents a simplified summary of the disclosed subject matter to provide a basic understanding of some aspects of the various embodiments. This summary is not an extensive overview of the various embodiments. It is intended neither to identify key or critical elements of the various embodiments nor to delineate the scope of the various embodiments, Its sole purpose is to present some concepts of the disclosure in a streamlined form as a prelude to the more detailed description that is presented later.

One example embodiment is an inverter assembly. The inverter assembly has a front side, a backside, a left side, and a right side. The inverter assembly further has one or more direct current (DC) connectors on the front side and an upper DC bus is connected to the DC connector. One or more capacitor(s) may be mounted below the upper DC bus near the front of the inverter assembly. A lower DC bus is connected to the upper DC bus and a liquid cooled cold-plate cooling unit is positioned between the upper DC bus and the lower DC bus. A first SiC half-bridge unit is located between the upper DC bus and the cold-plate cooling unit and a second SiC half-bridge unit is located between the lower DC bus and the cold-plate cooling unit. A first driver unit is located on the upper DC bus above the first SiC half-bridge unit to drive the DC signal to the first SiC half-bridge unit. A second driver unit is located beneath the lower DC bus and below the second SiC half-bridge unit to also convert the DC signal into an AC signal. An AC output connector is located on the backside of the inverter assembly. An AC bus segment with three phase first ends and a second ends has its first ends connected to the first and second SiC half-bridge units and its second ends connected to the AC output connecter.

Another configuration includes a bi-directional DC to AC and AC to DC converter that may be used in high power inverters. The DC to AC converter includes an upper DC bus with a top surface and a bottom surface for receiving a DC signal, a lower DC bus with a top surface and a bottom surface, cold-plate cooling unit with a top surface and a bottom surface, a first SiC half-bridge unit with a top surface and a bottom surface, a second SiC half-bridge unit with a top surface and a bottom surface, and first and second driver units. The lower DC bus is connected to the upper DC bus so that they are at the same DC voltage potential. The upper surface of the first SiC half-bridge unit is located beneath the lower surface of the upper DC bus and above the upper surface of the cold-plate cooling unit. The second SiC half-bridge unit is located above the upper surface of the lower DC bus and beneath the lower surface of the cold-plate cooling unit. The first driver unit is located on the upper surface of the upper DC bus and above the upper surface of the first SiC half-bridge unit and the second driver unit is located under the lower surface of the lower DC bus and below the bottom surface of the second SiC half-bridge unit. The first driver unit/first SiC half-bridge unit and the second driver unit/second SiC half-bridge unit convert the DC signal into an AC signal.

Another configuration is "flow-through" power inverter bus for use in a power inverter. The flow-through power inverter bus includes a first flow-through bus segment having a first end and a second end for transmitting a first DC voltage, a second flow-through bus segment having a first end and a second end for transmitting a second DC voltage, and a third flow-through bus segment having a first end and a second end. The power inverter has a front side, a backside, a left side, and a right side. The first end of the first flow-through bus segment receives the first DC voltage from a DC input connector and the first end of the second flow-through bus segment receives the second DC voltage from the DC input connector. The second end of the third flow-through bus segment delivers an AC current to an AC output connector.

One or more high power capacitors are configured to be mounted near the front side of the power inverter with a first terminal of the one or more high power capacitors connected to the first flow-through bus segment and a second terminal of the one or more high power capacitors connected to the second flow-through bus segment. A first SiC half-bridge unit is configured to be formed on a bottom side of the first flow-through bus segment and to be formed adjacent the backside of the power inverter, One or more upper driver units are configured to be mounted above a top side of the first flow-through bus segment opposite the first SiC half-bridge unit below the bottom side of the first flow-through bus segment. The first end of the third flow-through bus segment is configured to connect to the first SiC half-bridge unit. The first flow-through bus segment is configured to be connected to the upper gate drivers. A cooling plate is configured to be attached to the first SiC half-bridge unit. The first end of the third flow-through bus segment is configured to be connected to outputs of the first SiC half-bridge unit and the second end of the third flow-through bus segment is configured to be connected to the AC output connector.

Another example is a method of converting high power direct current (DC) voltage to high power alternating current (AC) and vice versa, using a flow-through bus. A DC voltage is received onto an upper DC bus. The DC voltage is then filtered on the upper DC bus with capacitance to remove electromagnetic interference (EMI). The method next generates the AC voltage by rectifying the DC voltage using DC to AC converters. The AC voltage is then received at an AC output connector. The AC voltage may then power a high power AC voltage device.

The following description and the annexed drawings set forth in detail certain illustrative aspects of the subject matter. However, these aspects are indicative of some of the numerous ways in which the principles of the subject matter can be employed. Other aspects, advantages, and novel features of the disclosed subject matter will become apparent from the following detailed description when considered in conjunction with the drawings. It will also be appreciated that the detailed description may include additional or alternative embodiments beyond those described in this summary.

BRIEF DESCRIPTION OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example embodiments and other example methods of various aspects of the invention. It will be appreciated that the illustrated element boundaries (e.g., boxes, groups of boxes, or other shapes) in the figures represent one example of the boundaries. One of ordinary skill in the art will appreciate that in some examples, one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
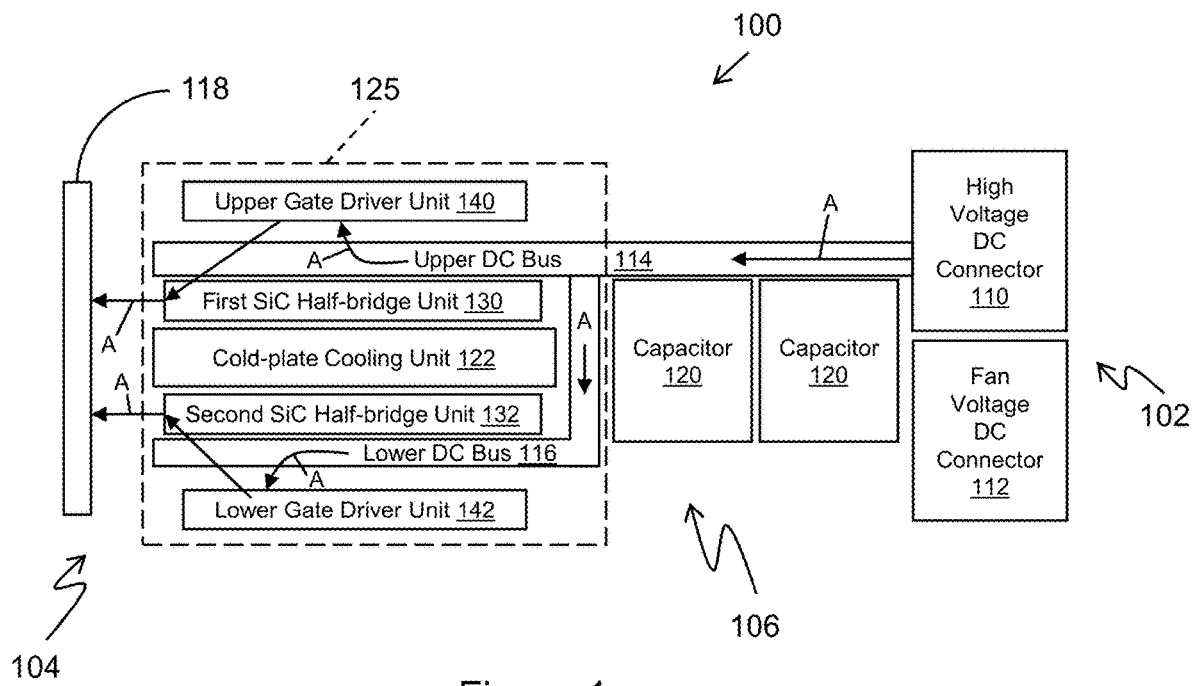
FIG. 1 illustrates a first example left side view of an embodiment of power inverter that utilizes silicon carbide (SiC) half-bridges.

Fundamentally, a power inverter, or assembly, is a device that bi-directionally converts direct current (DC) into alternating current (AC), and vise-versa using a series of electronic switches and electronic feedback systems to facilitate stable conversion. The inverter assembly (e.g., power inverter 100 of FIGS. 1-9 is additionally significantly focused on power delivery unlike prior art power inverters. The power inverter 100 of FIGS. 1-9 is a compact, power dense, high temperature/operation power inverter 100 that utilizes silicon carbide (SiC) to significantly decrease heat issues at key locations in the power inverter 100. To reduce heat generation, this power inverter 100 utilizes SiC half-bridge rectifiers when generating an AC signal from a DC signal. The power inverter 100 of FIGS. 1-9 utilize a power stage that is a "flow-through" architecture (busses generally flow from front to back) in concert with SiC technology as well as specialized control feedback electronics to implement an AC signal from a DC signal. Flow-through buswork design is unique because it's design allows the electrical energy to flow-through from the DC stages to the AC switch stages with minor restriction (e.g., generally straight through without looping or reverse travel) thus minimizing electrical bus area while yielding highest power delivery at lowest possible power loss. This significantly lowers the electrical impedance and inductance of the power path as well as lowers the typically required DC link capacitor and AC switch snubber stage size. This in turn improves thermal performance, serviceability, and significantly reduces production/assembly time. This results in the power inverter 100 with silicon carbide having a current capability of 200 kW or more in an ultra-compact arrangement, with power densities of up to 27 kW/L at the power stage and 16 kW/L overall with connectors and enclosure included. Dimensions of less than 100 mm×200 mm×300 mm, may operate with coolant temperature exceeding 105 degrees Celsius and ambient temperatures exceeding 125 degrees Celsius, for bi-directional power capabilities (power can be converted from AC to DC). The power inverter 100 is capable of driving/accepting power from a majority of drive system motors/generators commercially available today with a similar power rating as the power inverter 100.

Having a power inverter 100 operational at this elevated temperature capability is useful in a variety of apparatus, devices, systems, environments, and the like. The power inverter 100 of FIGS. 1-9 that uses SiC based half-bridge rectifiers as well as a cold plate flowing cooling fluid drastically reduces the need for a high cooling system envelope of hybrid-electric military vehicles. One reason for this is because engine coolant can be used in the cold plate to cool the power inverter 100, the SiC half bridge rectifiers generate minimal heat compared to prior rectifiers, and, also, the ultra-compact design frees up valuable space for other critical systems and personnel. Its high power capability allows for the use of advanced vehicle start/stop technology, the use of pure electric or hybrid-electric drivetrains enabling silent mobility, the use of electrified cooling systems, the use of electric power steering, electric vehicle assist componentry, advanced power weaponry, vehicle-to-electrical-grid as a back-up power source, and the like. Traditional inverter systems are not capable of delivering the performance required because of fundamental limitations due to overall size, current power output, and the requirement of lower temperature coolant for safe operation. This results in having the ability to be use the power inverter 100 in (but not limited to): advanced vehicle start/stop technology hybrid-electric drivetrain, pure electric drivetrain, electrified cooling systems, electric power steering, electric assist component, advanced power weaponry, vehicle-to-electrical-grid, alternative energy conversion, and traditional permanent magnet AC (PMAC) motor drive systems.

The inverter assembly (power inverter) 100 of FIG. 1-9 is now discussed in more detail. The inverter assembly 100 is roughly rectangularly shaped and has a front side 102, a backside 104, a left side 106, and a right side 108. In general, the inverter assembly 100 includes a high voltage direct current (DC) connector 110, a fan voltage DC connector 112, an upper DC bus 114, a lower DC bus 116, an AC output connector 118, at least one capacitor 120, a liquid cooled cold-plate cooling unit 122, a first SiC half bridge unit 130, a second SiC half-bridge unit 132, a first gate driver unit 140, a second gate driver unit 142, and an AC bus segment(s) 150.

The high voltage DC connector 110 is on the front side 102 of the inverter assembly 100 and the upper DC bus 114 is connected to the high voltage DC connector 110. The capacitor(s) 120 is mounted under the upper DC bus 114 near a corner formed by the left side 106 and front side 102 of the inverter assembly 100 and are connected between a high DC voltage and a low DC voltage input. The at least one capacitor 120 has a combined value of between 200 and 400 uF. Analog simulations indicated that two capacitors 120 provide an optimal performance, but any number of capacitors may be used to implement a desired capacitance value.

Figure 3:
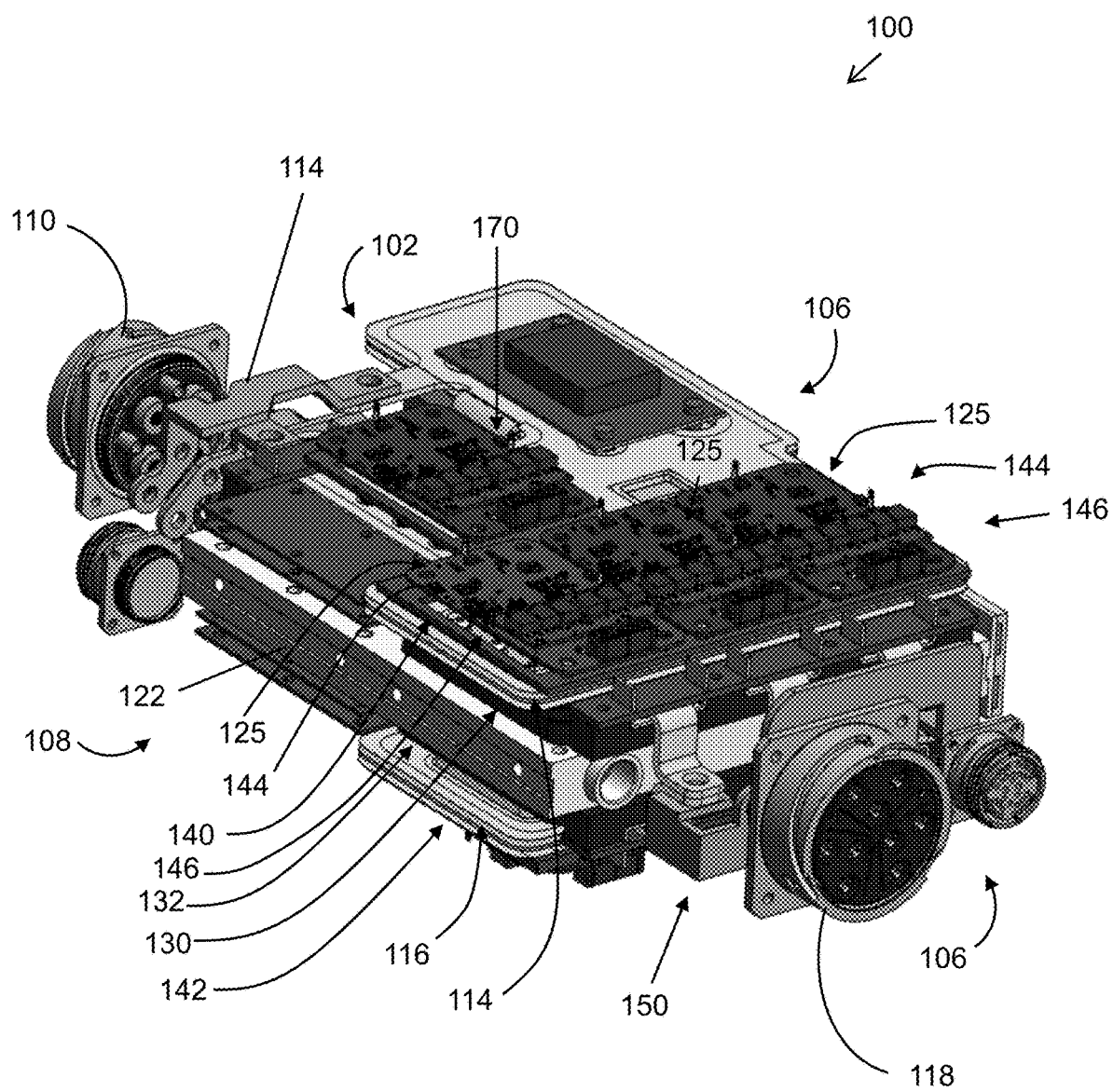
FIG. 3 illustrates an example backside, right side, and top perspective view of another embodiment of a power inverter utilizing SiC half-bridges.
Figure 4:
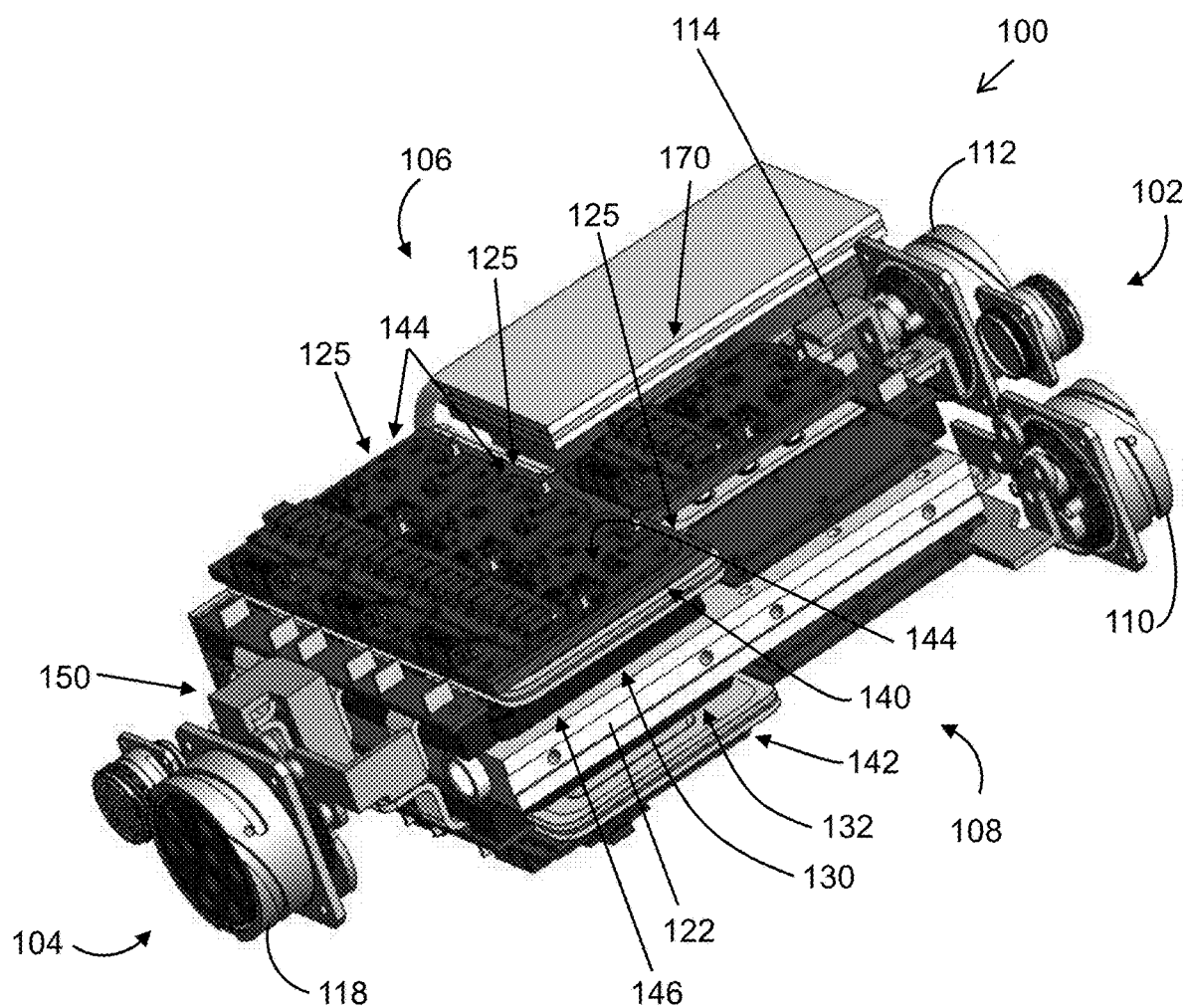
FIG. 4 illustrates an example bottom, right side, and backside perspective view of the embodiment of a power inverter of FIG. 3.
Figure 5:
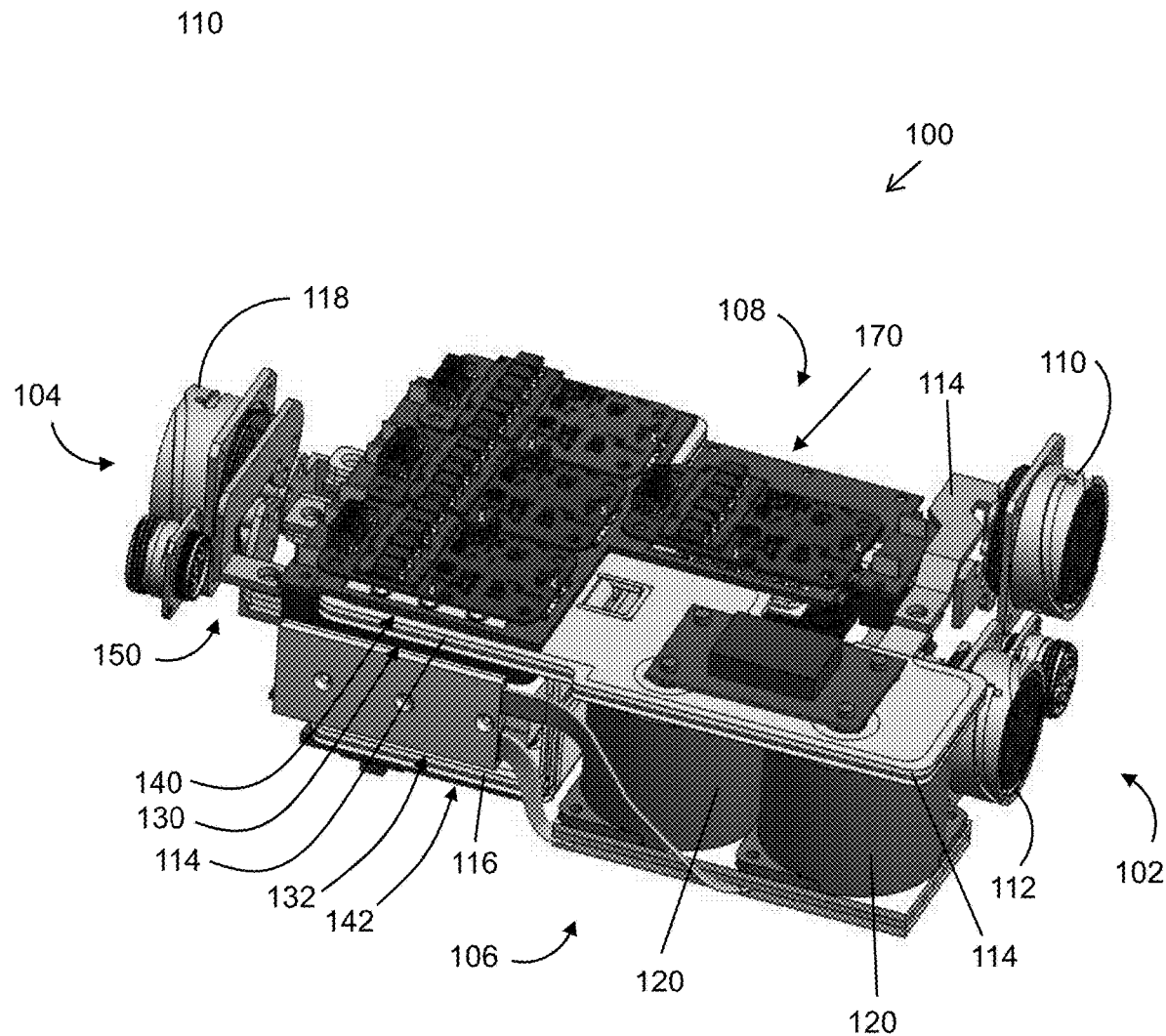
FIG. 5 illustrates an example front side, left side, and top perspective view of the embodiment of a power inverter of FIG. 3 showing the SiC half-bridges.
Figure 6:
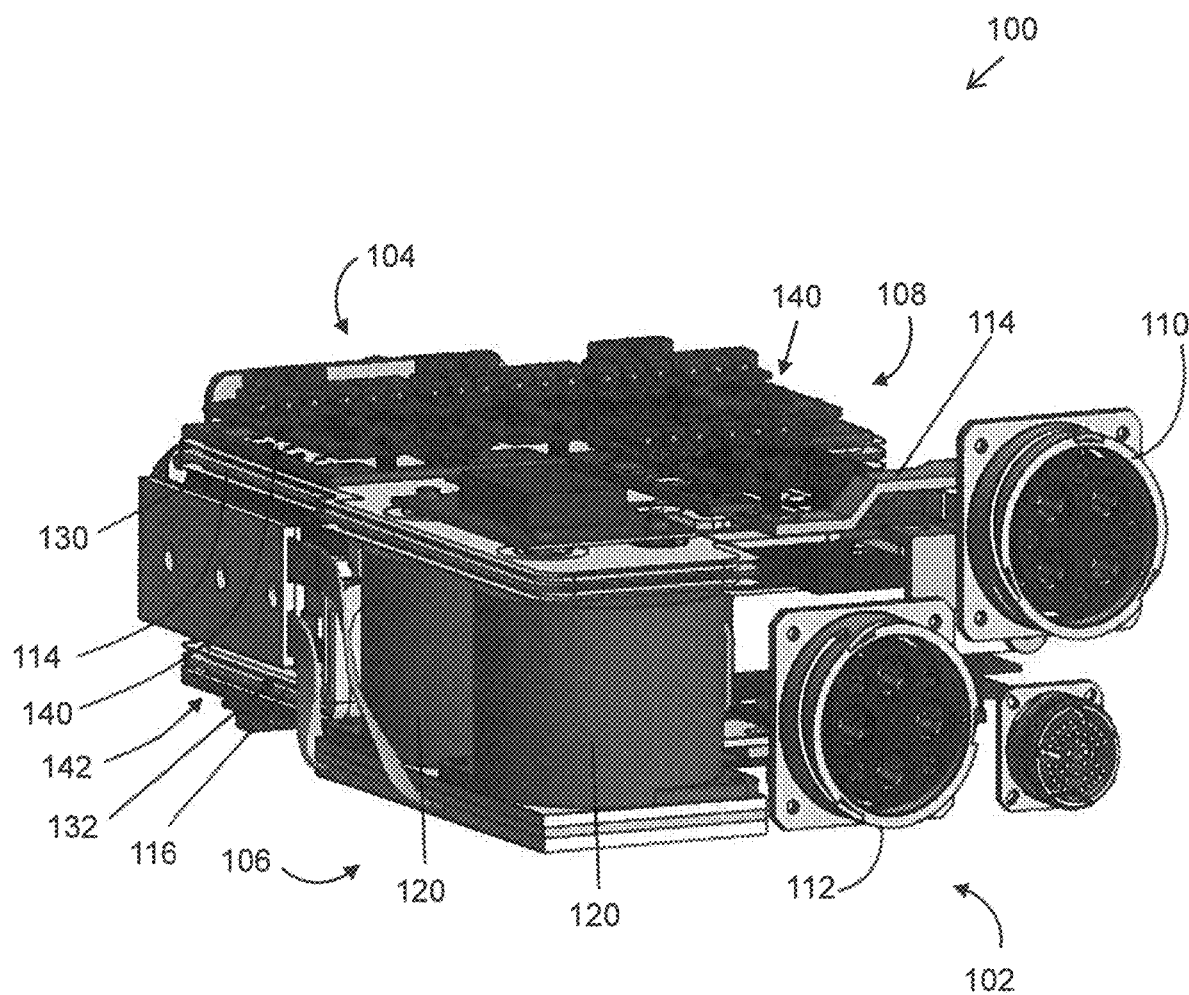
FIG. 6 illustrates an example front side, left side, and top perspective view of the embodiment of a power inverter of FIG. 3 showing the AC phase busses within the SiC half-bridges.
Figure 7:
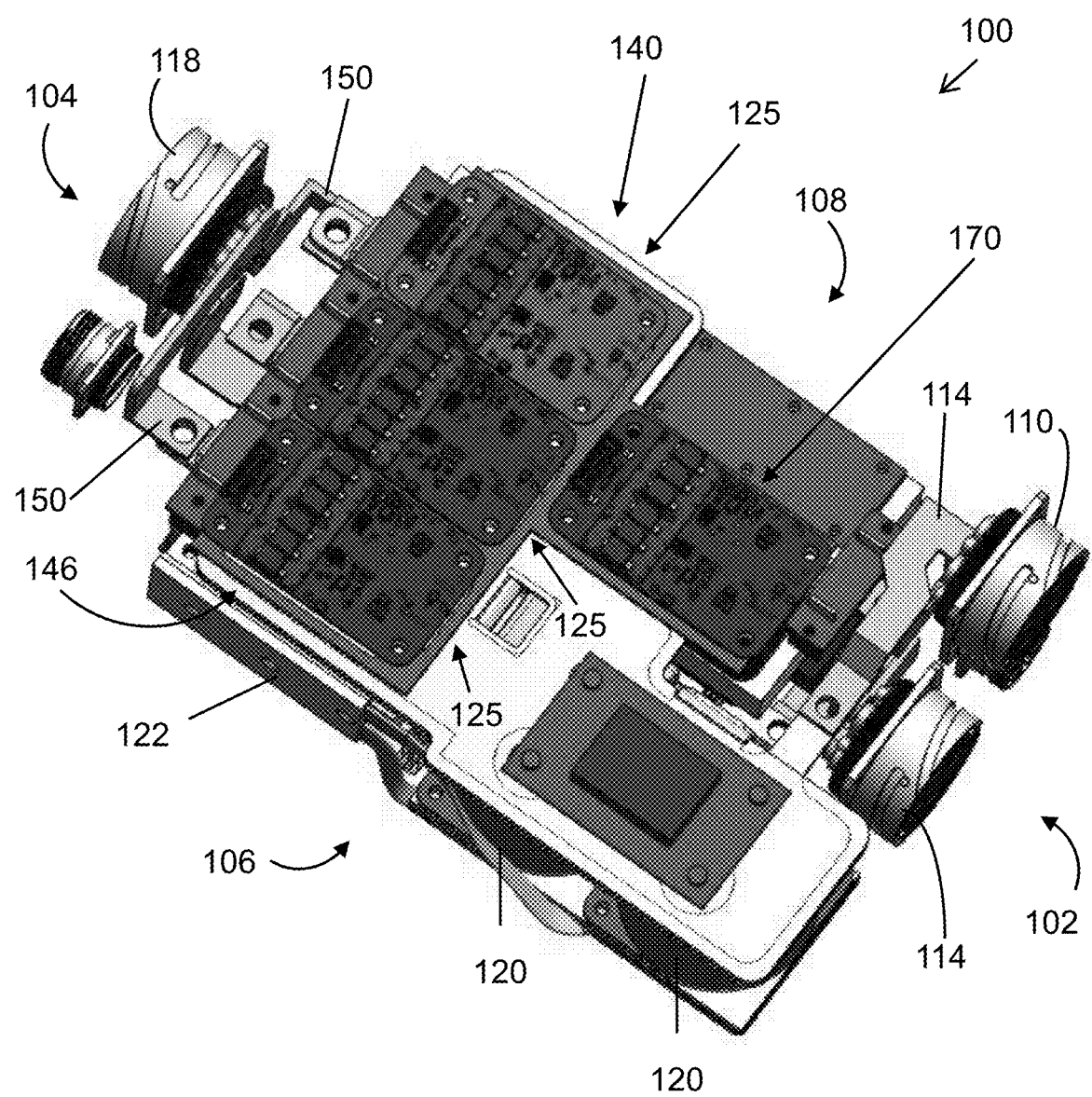
FIG. 7 illustrates an example front side, left side, and top perspective view of the embodiment of a power inverter of FIG. 3 showing the DC to AC converters.
Figure 8:
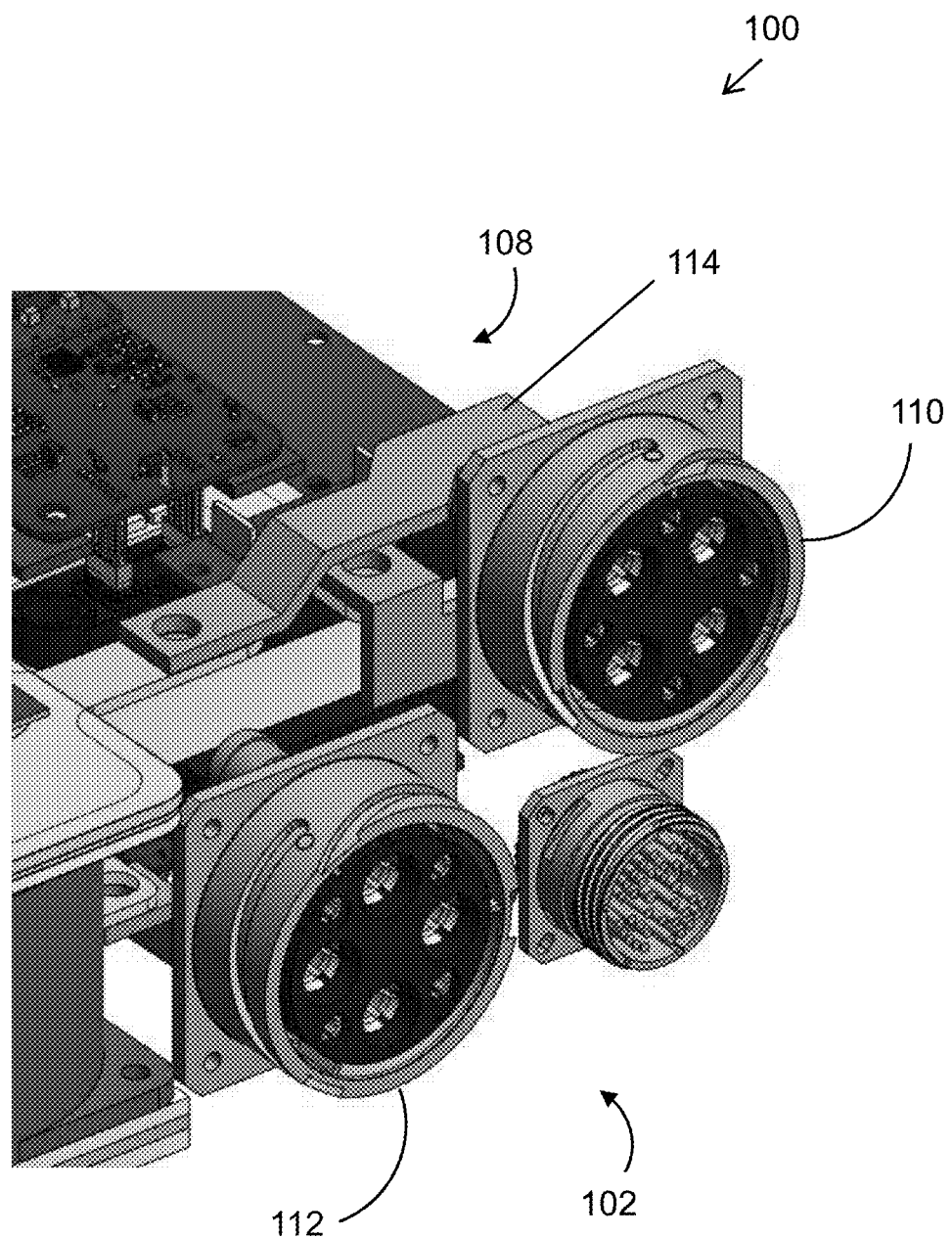
FIG. 8 illustrates an example front side and top perspective view of the embodiment of a power inverter of FIG. 3 showing detail of the DC bus.
Figure 9:
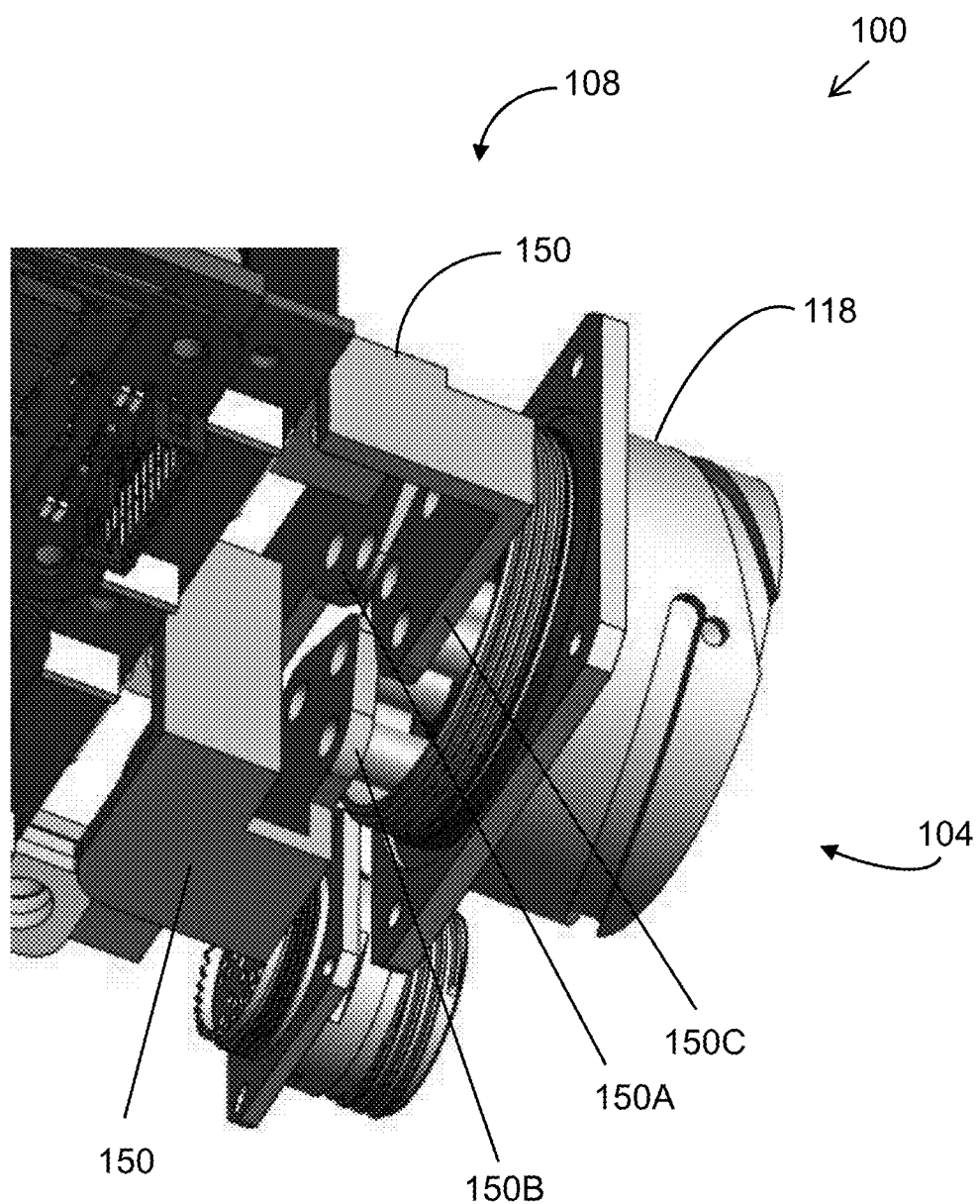
FIG. 9 illustrates an example backside perspective view of the embodiment of a power inverter of FIG. 3 showing detail of the AC bus.

A DC to AC voltage transformation assembly 125 is now discussed. Of course, when converting DC current/voltage to AC current/voltage this assembly 125 would work in the reverse. Also, and as discussed later with reference to FIG. 11, this assembly may include AC to DC (or DC to AC when operated in reverse) converters formed with a data driver 144, a half-bridge unit 146, and a Hall-effect current sensor as generally seen in FIGS. 3, 4 and 7. The voltage transformation assembly 125 is generally formed by a portion of the upper DC bus 114, the lower DC bus 116 as well as the liquid cooled cold-plate cooling unit 122, the first SiC half-bridge unit 130, and that second SiC half-bridge unit 132. The lower DC bus 116 is connected to the upper DC bus 114 so that they are at the same DC voltage potential. The liquid cooled cold-plate cooling unit 122 is positioned between the upper DC bus 114 and the lower DC bus 116. The first SiC half-bridge unit 130 is located between the upper DC bus 114 and a top of the cold-plate cooling unit 122. The second SiC half-bridge unit 132 is located between the lower DC bus 116 and a bottom of the cold-plate cooling unit 122. The first gate driver unit 140 is located on the upper DC bus 114 above the first SiC half-bridge unit 130 and drives the DC signal to the first SiC half bridge unit 130. The second gate driver unit 142 is located on the lower DC bus 116 below the second SiC half-bridge unit 132 and similarly drives the DC signal to the second SiC half bridge unit 132.

In one example embodiment, the first and second half-bridge units 130, 132 may, for example be manufacture by Cree. For example, the half-bridge units may have characteristics of: 1200V, 325A, Silicon Carbide High-Performance 62 mm Half-Bridge Module, similar to Cree's SKU: CAS325M12HM2. The technical features of the first and second half-bridge units 130, 132 may include one or more of: ultra-low loss, low inductance, high-efficiency operation, high-frequency, ultra-fast switching operation, zero reverse-recovery current from diode, zero turn-off tail current from MOSFET, normally-off, fail-safe device operation, ease of paralleling, an AlSiC baseplate and $Si_3N_4$ AMB insulator, enhancing ruggedness with respect to thermal cycling, and/or other features as desired.

In some configurations, twelve upper gate driver units 140 (separated into high and low side drivers, two per gate driver circuit card to support SiC half-bridge topology), or some other desired number of drivers are located on the upper DC bus 114 above one or more SiC half-bridge units 130. Similarly, twelve lower gate driver units 142 are located below the lower DC bus 116 below one or more SiC half-bridge units 132. The SiC half-bridge units 130, 132, with the gate driver units 140, 142 are configured to simultaneously convert the DC signal into a three-phase AC signal. In some configurations, the first and second gate driver units 140, 142 are each additionally formed with transistors, and/or other components as desired.

The AC output connector 118 is located on the backside of the inverter assembly 100. The AC bus segment 150 has three portions 150A-C for the three phases of electrical power with each portion each having a first end and a second end. The first ends are connected to the SiC half-bridge units 130, 132 and the second ends are connected to the AC output connecter 118. The power inverter 100 of FIGS. 1-9 utilizes a power stage with associated busses that is "flow-through" architecture in concert with high power SiC half-bridge technology and as well as specialized control feedback electronics.

Figure 2:
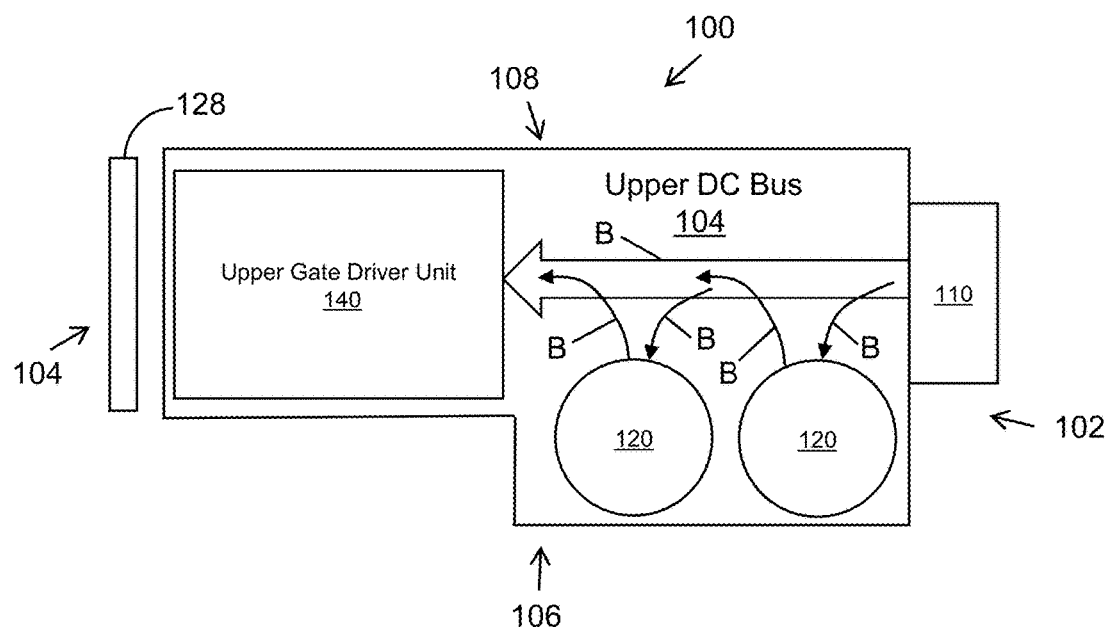
FIG. 2 illustrates an example top view of the example embodiment of the power inverter of FIG. 1.

As previously mentioned, flow-through bus-work design is unique because it allows the electrical energy to flow-through from the DC stages to the AC switch stage, or vice versa, with minor restriction (e.g., generally straight through without looping or reverse travel). For example, as illustrated in FIGS. 1 and 2, the upper DC bus 114 and lower DC bus 116 simply travel from the front side 102 to the backside 104 in one continuous flow with only minimal deflection of current as indicated by arrows "A" in FIG. 1 and arrows "B" in FIG. 2. Note that those of ordinary skill in the art will appreciate that this inverter is bi-directional so that current flows in the opposite direction of arrows "A" when converting AC current to DC current.

The rather direct "flow through path" lowers the impedance and inductance of the power path as well as lowers the typically required DC link capacitor stage size. This in turn improves thermal performance, serviceability, and significantly reduces production/assembly time. As mentioned earlier, the power inverter 100 with silicon carbide (SiC) is currently capable of 200 kW or more in an ultra-compact arrangement, with power densities of up to 27 kW/L. The inverter assembly 100 is capable of 200 kW or more in an ultra-compact arrangement with power densities of 27 kW/liter or more at the power stage and 16 kW/L overall with connectors and enclosure included. Due, in part, to the flow-through path of the upper DC bus, the inverter assembly 100 may generally be a small/compact rectangular box shape with rectangular dimensions less than 301 mm×228 mm×110 mm.

In some embodiments, the upper DC bus 114 is connected to a first DC voltage at the DC connector 110, as previously mentioned. However, a second DC voltage bus is connected at one end to a different second DC voltage at the DC connector 110 and is used as a chassis ground.

In some other embodiments, the half-bridge units (i.e., rectifiers, switches) 130, 132 may be switched at any application specific frequency, typically 1-50 kHz for motor/generator applications, by a DSP 170 or another microcontroller (discussed further below) to produce a three-phase output. Other embodiments may switch the half-bridge rectifiers 130, 132 at another suitable frequency to produce an adequate three phase output. In some embodiments, the AC output signal may have peak values of 1200 volts at 600 amps and nominal values of 600 volts at 325 amps. At these values, the three-phase system generated by the inverter assembly 100 may operate at a relatively high coolant temperature of about 105 degrees Celsius through the cold-plate cooling unit and nominally convert about 200 kW of power. An inverter constructed similar to the inverter assembly 100 illustrated in FIGS. 1-9 has been prototyped and successfully tested to at least the nominal values over a 45-minute time frame considered to be continuous operation. Because the DC to AC converters 140, 142 are mounted adjacent the SiC half-bridge Units 130, 132, which are adjacent the cold plate cooling unit 122, heat is readily dissipated to allow for high power operation of the inverter assembly 100. Based on the initial performance of the inverter assembly of FIGS. 1-9, when a vehicle is operated using the inverter assembly 100 and is flowing standard engine coolant of the vehicle through the liquid cooled cold-plate cooling unit 122, the inverter assembly 100 is operational at 105 degrees C. and 200 kW.

In another embodiment, the high-power inverter assembly 100 includes the digital signal processor (DSP) 170, first mentioned above. The DSP 170 receives feedback from the DC to AC voltage transformation assembly 125. For example, the feedback may be sensor feedback associated with a shape of an AC signal that the DC to AC voltage transformation assembly 125 is generating and outputting. In essence, this feedback generally indicates to processor (DSP controller) 170 how the AC signals are actually formed. The DSP 170 may then adjust controls to the DC to AC voltage transformation assembly 125 to produce a desired AC signal based, at least in part, on the feedback.

"Processor" and "Logic", as used herein, includes but is not limited to hardware, firmware, software and/or combinations of each to perform a function(s) or an action(s), and/or to cause a function or action from another logic, method, and/or system. For example, based on a desired application or needs, logic and/or processor may include a software-controlled microprocessor, discrete logic, an application specific integrated circuit (ASIC), a programmed logic device, a memory device containing instructions or the like. Logic and/or processor may include one or more gates, combinations of gates, or other circuit components. Logic and/or a processor may also be fully embodied as software. Where multiple logics and/or processors are described, it may be possible to incorporate the multiple logics and/or processors into one physical logic (or processor). Similarly, where a single logic and/or processor is described, it may be possible to distribute that single logic and/or processor between multiple physical logics and/or processors.

In other configurations, the inverter assembly 100 may contain other useful components and features. In some embodiments, a transient voltage suppressor (TVS) may be added to the upper DC bus 114 to begin suppression of electromagnetic noise and may include electromagnetic hardening, electromagnetic shielding walls, and other interference suppression techniques may be implemented, as desired. The inverter 100 may be small enough to be used in commercial trucks, military vehicles, and other vehicles. While operating in trucks, military vehicles and the like, the AC output from the inverter assembly 100 may be used with a "pancake" generator or another type of generator to generate electricity to power government facilities, infrastructure, businesses and homes after a disaster, power the vehicle in a stealth mode with electrical power converted by the inverter assembly previously stored in batteries, power electromagnetic weapons (lasers, directed energy, rail-gun and etc.) with DC power stored in batteries, as well as other operations requiring high AC power and/or high DC power.

Figure 10:
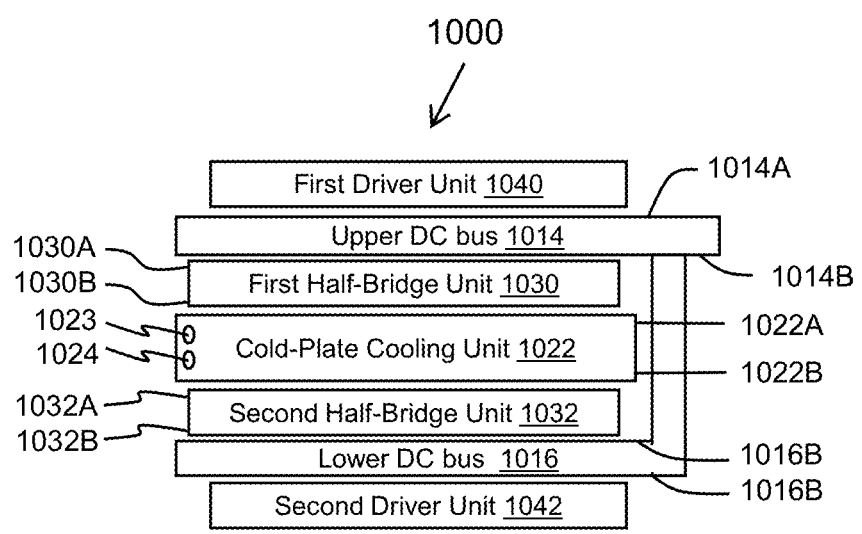
FIG. 10 illustrates an example side view of an example configuration of a DC to AC converter.

FIG. 10 illustrates an example configuration of a DC to AC converter 1000. In general, the converter 1000 includes an upper DC bus 1014 with a top surface 1014A and a bottom surface 1014B, a lower DC bus 1016 with a top surface 1016A and a bottom surface 10168, a liquid cooled cold-plate cooling unit 1022 with a top surface 1022A and a bottom surface 10228, a first SiC half-bridge unit 1030 with a top surface 1030A and a bottom surface 1030B, a second SiC half-bridge unit 1032 with a top surface 1032A and a bottom surface 1032B, a first driver unit 1040, and a second driver unit 1042.

The converter 1000 may have some similarities to the DC to AC voltage transformation assembly 125 discussed above. The upper DC bus 1014 may be connected to a high voltage DC connector (not illustrated in FIG. 10). The lower DC bus 1016 is connected to the upper DC bus 1014 so that they are at the same DC voltage potential. The upper surface 1030A of the first SiC half-bridge unit 1030 is located beneath the lower surface 1014B of the upper DC bus 1014 and the upper surface 1022A of the cold-plate cooling unit 1022. The second SiC half-bridge unit 1032 is located between the upper surface 1016A of the lower DC bus 1016 and the lower surface 1022B of the cold-plate cooling unit 1022. The first driver unit 1040 is located on the upper surface 1014A of the upper DC bus 1014 above the upper surface 1030A of the first SiC half-bridge unit 1030. The second driver Unit 1042 is located under the lower surface 1016B of the lower DC 1016 bus and below the bottom surface 1032B of the second SiC half-bridge unit 1032. Both the first driver unit 1040 and the second driver unit 1042 are configured to drive the DC signal to the SiC half-bridge units 130, 132. In other configurations, any a number of drivers 1040 may be located on the upper surface 1014A of the upper DC bus 1014 above the upper surface 1030A of the first SiC half-bridge units 1030 to achieve a desired AC signal. Similarly, any number of lower gate driver units 1042 may located under the lower surface 1016B of the lower DC bus 1016 below the lower surface 1032B of the second SiC half-bridge units 1032 to achieve a desired AC signal.

In some embodiments, the cold-plate cooling unit 1022 may be liquid cooled. For example, the cold-plate cooling unit 1022 may be cooled from a liquid coolant of a combustion engine that is operating on a vehicle that the converter 1000 is associated with. The cold-plate cooling unit 1022 may be cooled with oil or any desirable liquid by pumping liquid into a first opening 1023 in the cold-plate cooling unit 1022 and transferring the heated liquid through the cold-plate from a second opening 1024 in the cold-plate cooling unit 1022.

Figure 11:
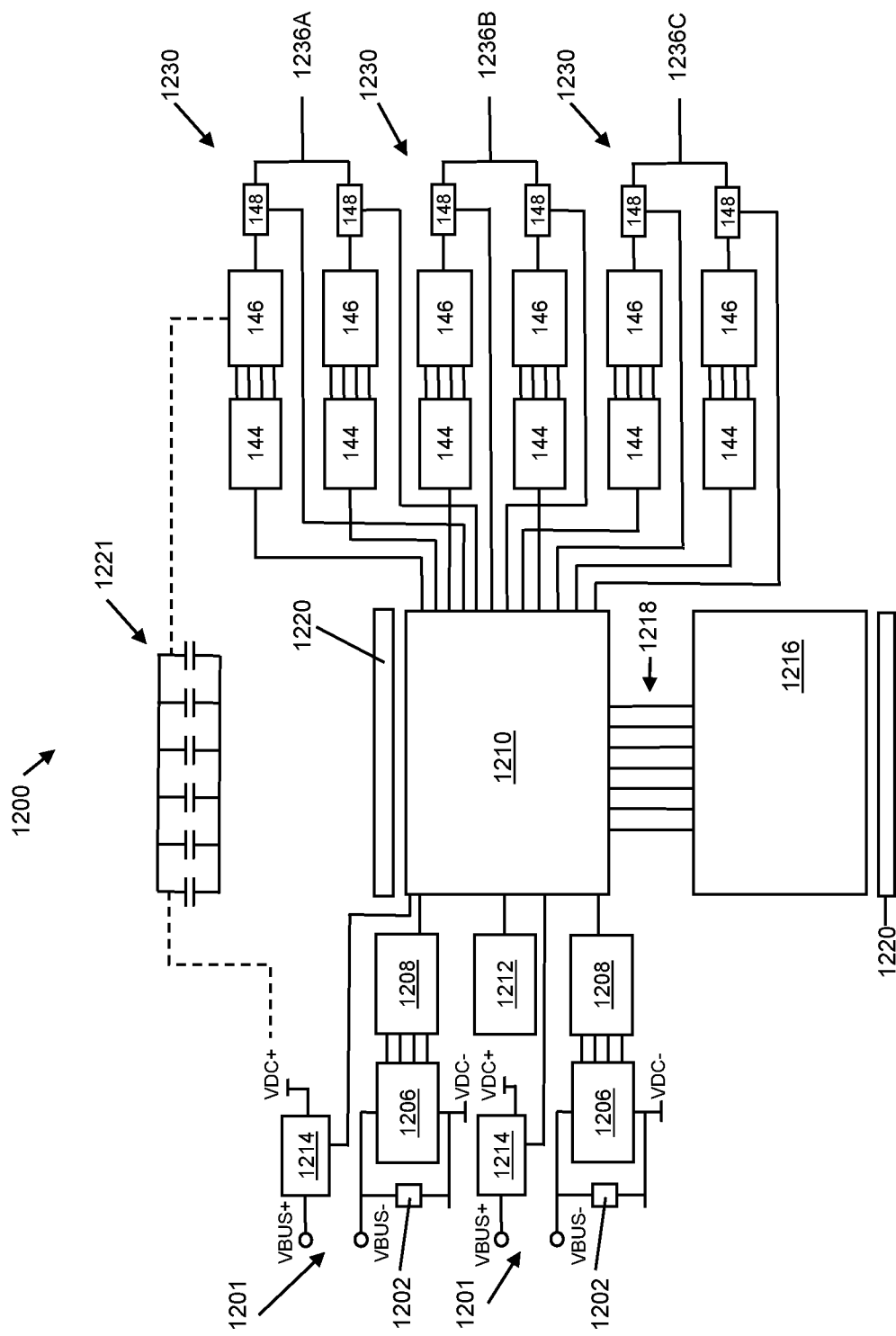
FIG. 11 illustrates an example electrical schematic view of an embodiment of a power inverter.

FIG. 11 illustrates one example of an electrical functional diagram 1200 of the example embodiments of the previous figures. The high voltage DC signals 1201 are received and initially pass through overvoltage protection circuits 1202. The overvoltage protection circuits 1202 may each include a Zener diode, a common source module 1206, a gate driver 1208, and/or other circuits as understood by one with ordinary skill in the art. These protected signals are input to a DSP controller 1210. A direct current voltage and ground fault interrupt (GFI) sensor 1212 may also be attached to the DSP controller 1210 to remove noise from a power signal. A pair of Hall-effect current sensors 1214 connected to the high voltage inputs also generate signals input to the DSP controller 1210 and a bank of capacitors 1221.

The DSP controller 1210 runs software instructions to aid in the creation of the AC output signal(s) similar to what was discussed above. The DSP controller 1210 is connected to low voltage electronics 1216 with interconnects 1218 or other connections. The low voltage electronics 1216 perform a variety of functions including a processing control area network (CAN) bus (CANBUS) secure protocol, processing motor resolve signals, and performing other "housekeeping" and related functions not easily performed in the DSP controller 1210, as understood by one of ordinary skill in the art. A Peltier cooler 1220 may be used to cool the DSP controller 1210 and/or the low voltage electronics 1216 to promote longer electronics lifespan.

Capacitors 1221 may be used to at least filter some noise from the high DC signal received as inputs. The filtered high DC voltage is input into six DC to AC (or AC to DC) converters 1230 so that AC output signals 1236A-C (or DC signal 1201) may be generated. Of course, in on other embodiments any desired number of DC to AC converters 1230 may be used to generate the AC output signals 1236A-C. As discussed above, the DC to AC (AC to DC) converters 1230 may include a date driver 144, a half-bridge unit 146, and a Hall-effect current sensor 148 forming portions of each of these converters 1230.

Figure 12:
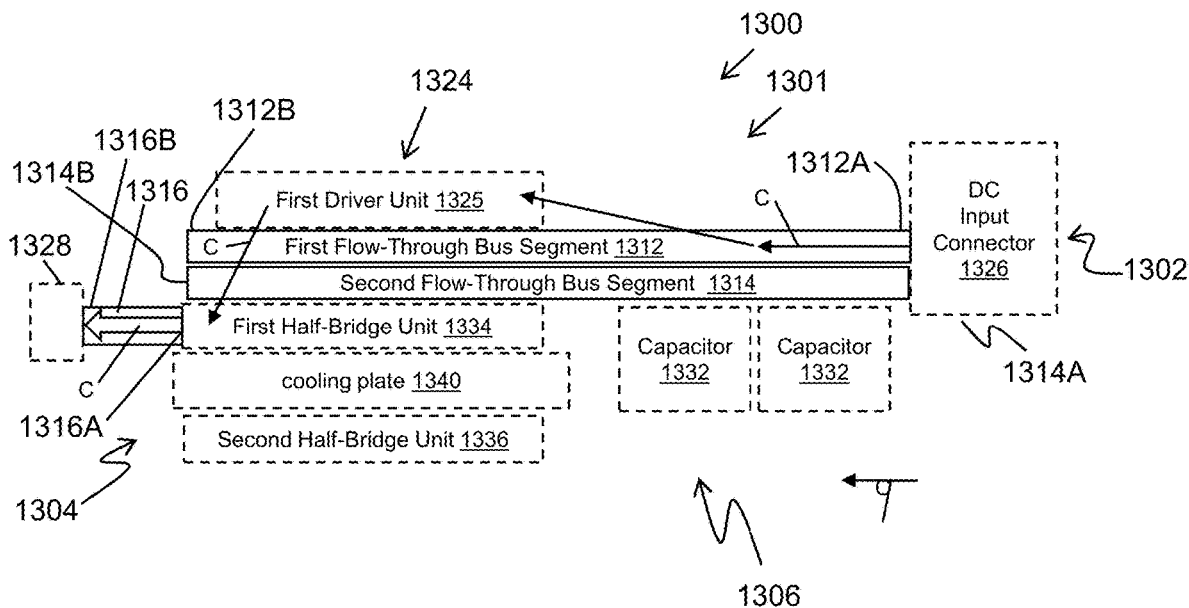
FIG. 12 illustrates an example side view of an embodiment of a flow-through power inverter bus.
Figure 13:
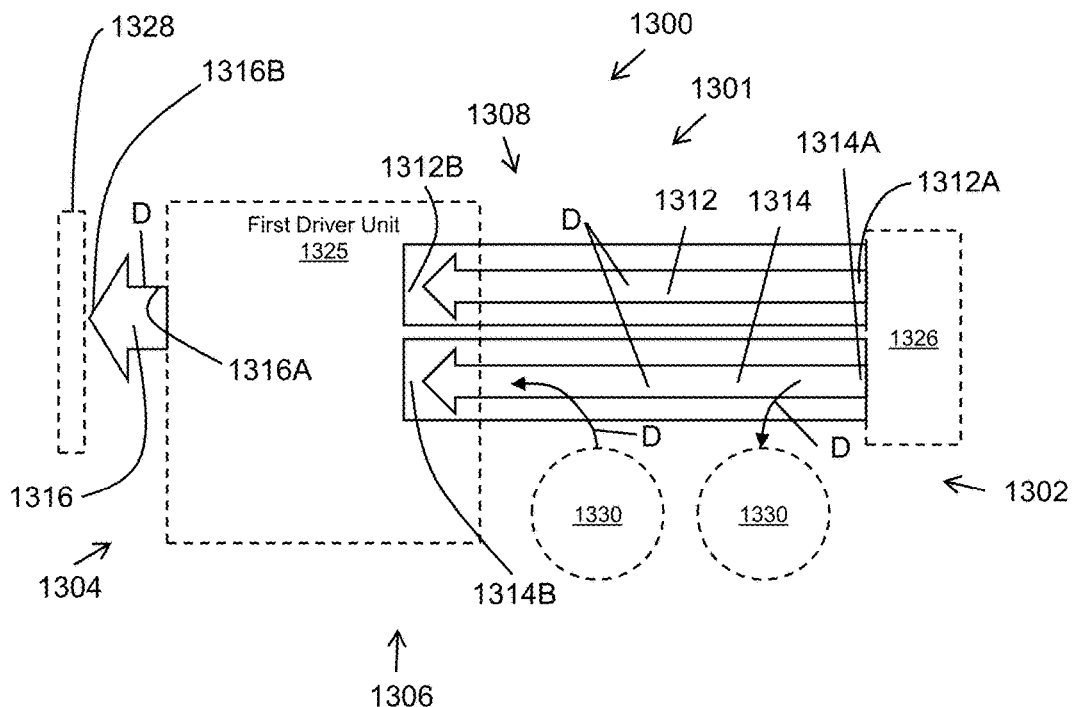
FIG. 13 illustrates an example top view of the embodiment of the flow-through power inverter bus of FIG. 12.
Figure 14:
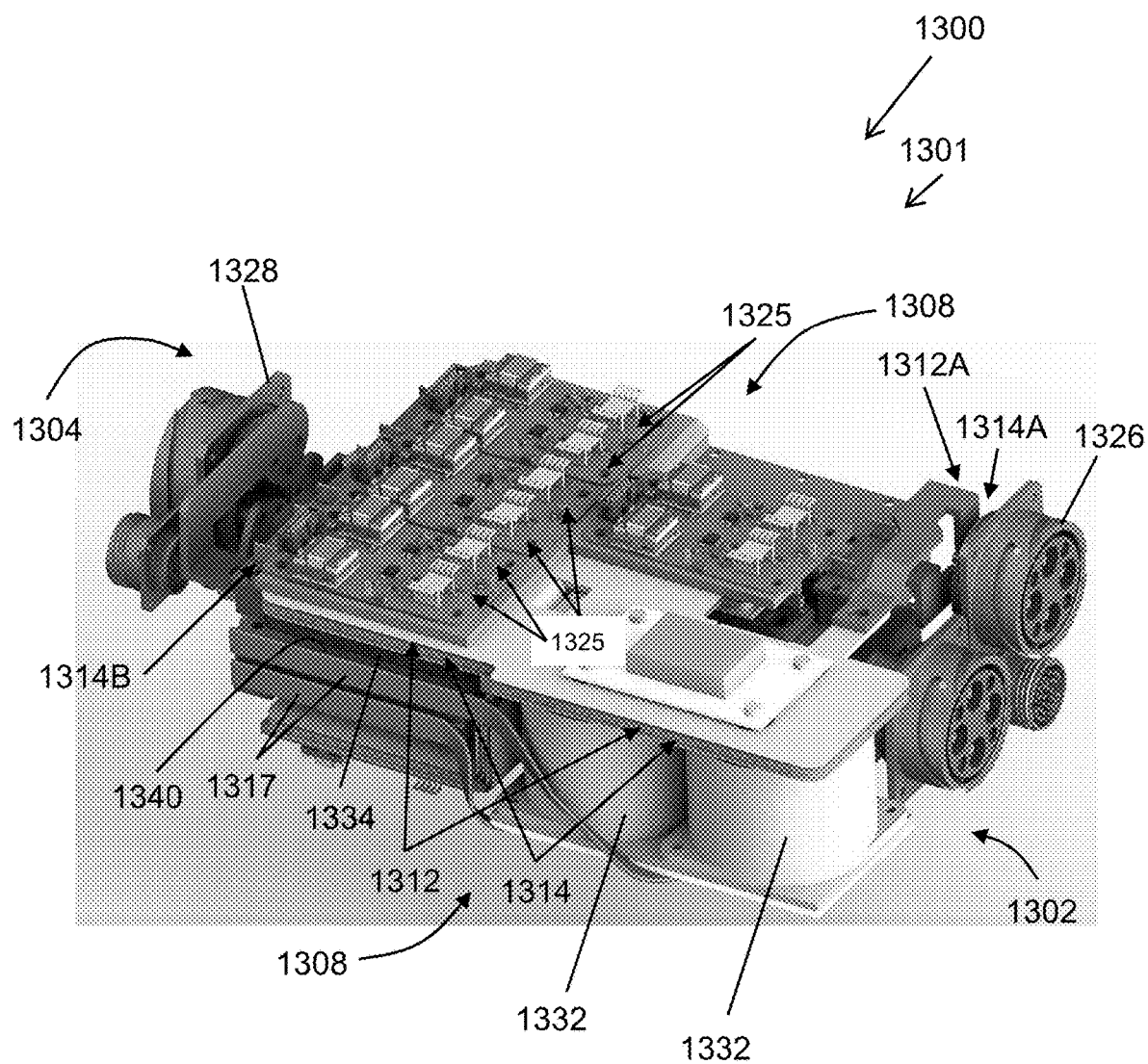
FIG. 14 illustrates an example left, top perspective view of the embodiment of the flow-through power inverter bus with capacitor cooling.
Figure 15:
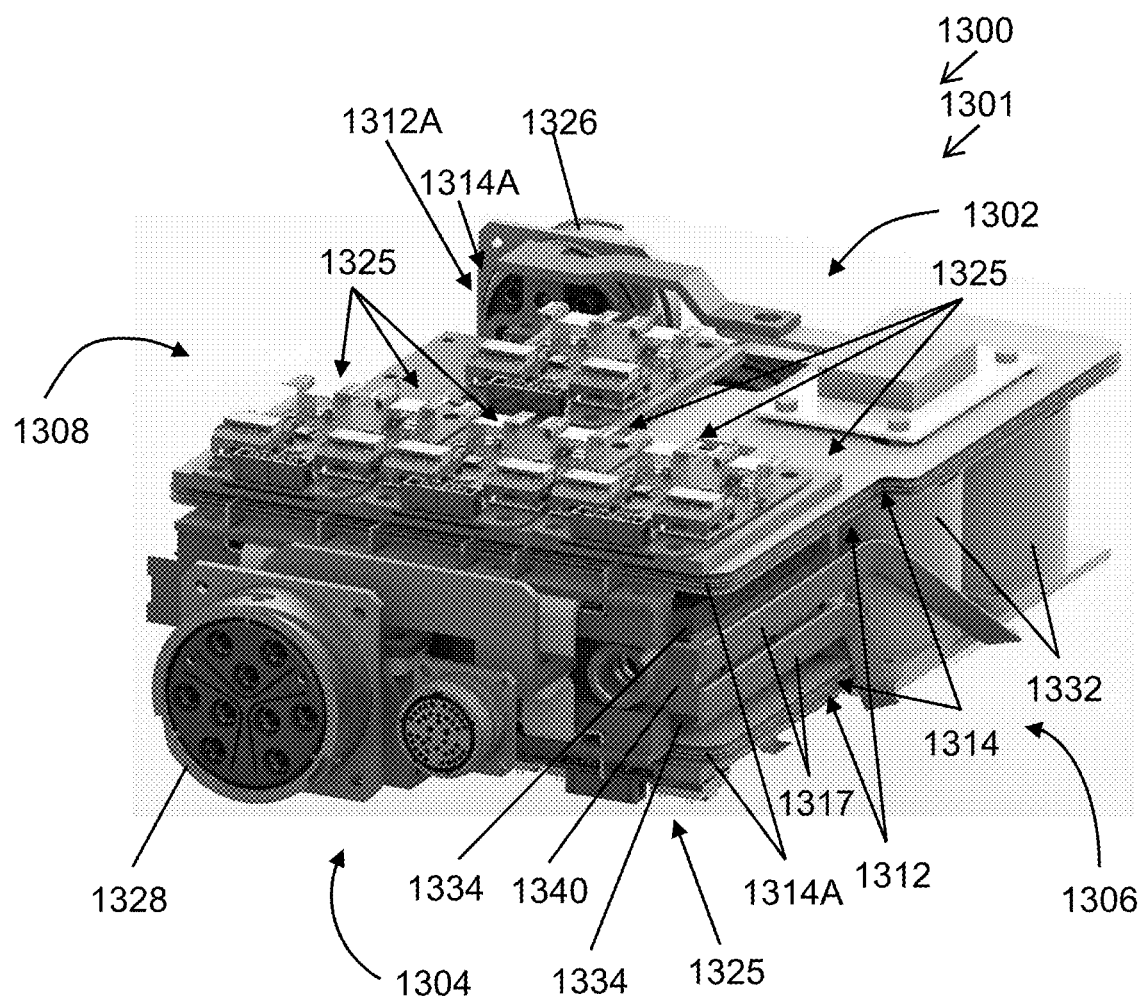
FIG. 15 illustrates an example left, top, backside perspective view of the embodiment of the flow-through power inverter bus of FIG. 14.
Figure 16:
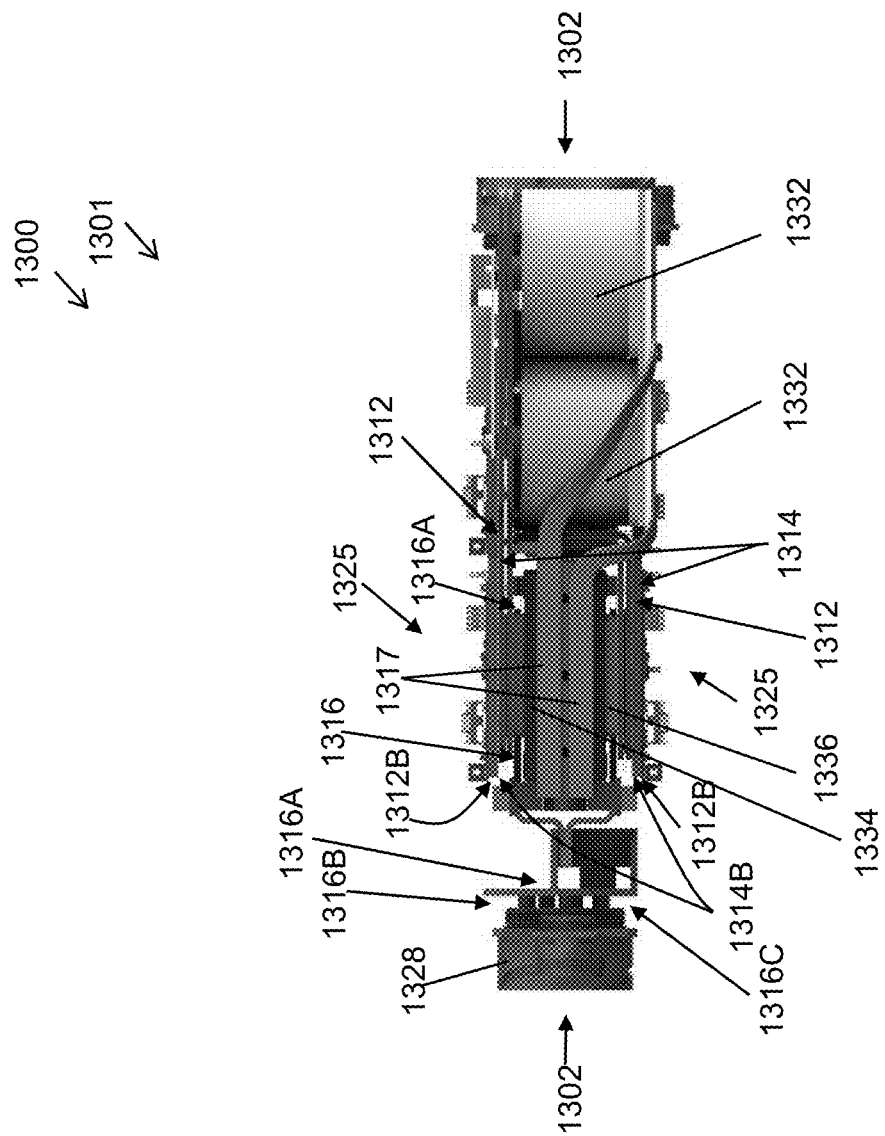
FIG. 16 illustrates an example left side view of the embodiment of the flow-through power inverter bus of FIG. 14.
Figure 17:
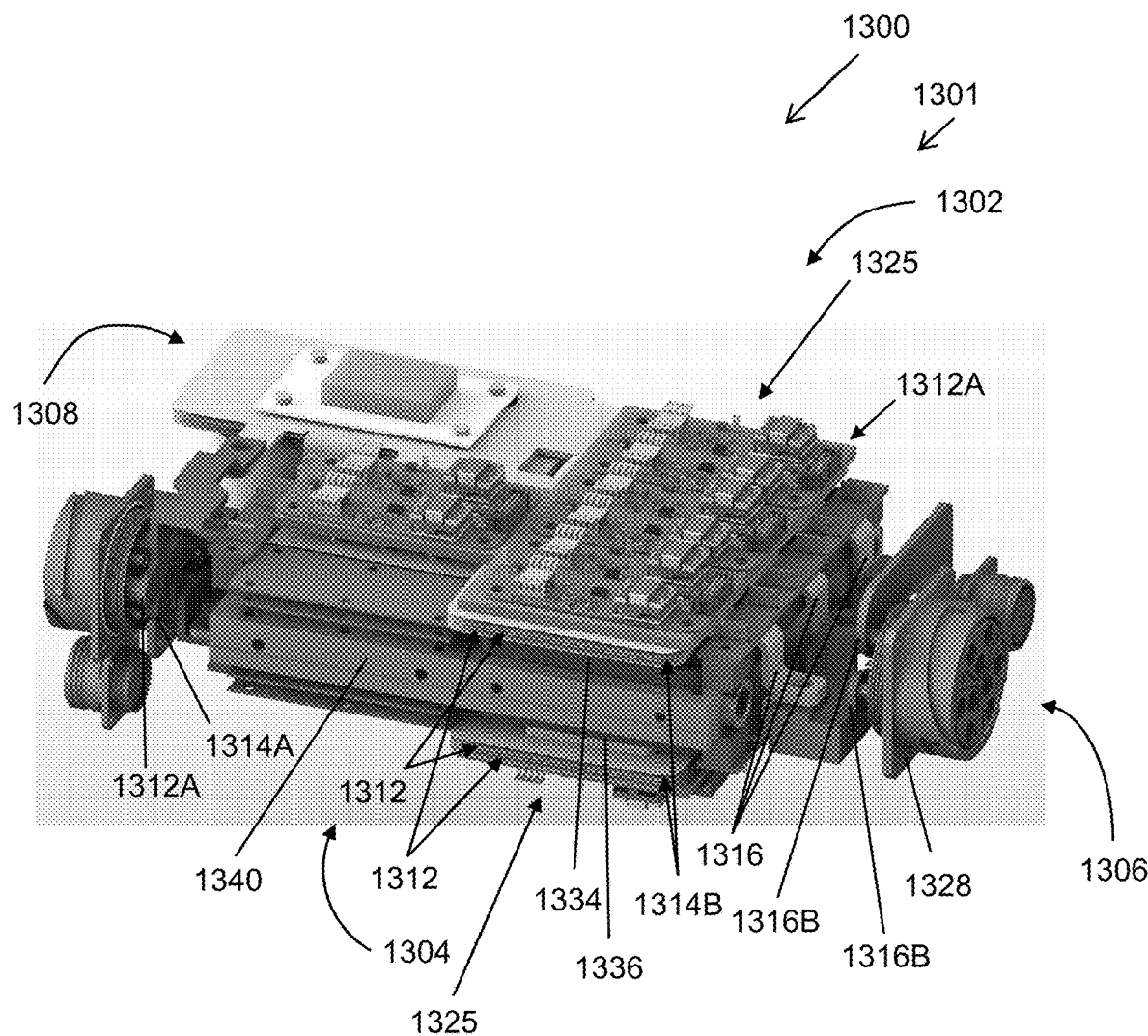
FIG. 17 illustrates an example top, right side, backside view of the embodiment of the flow-through power inverter bus of FIG. 14.
Figure 18:
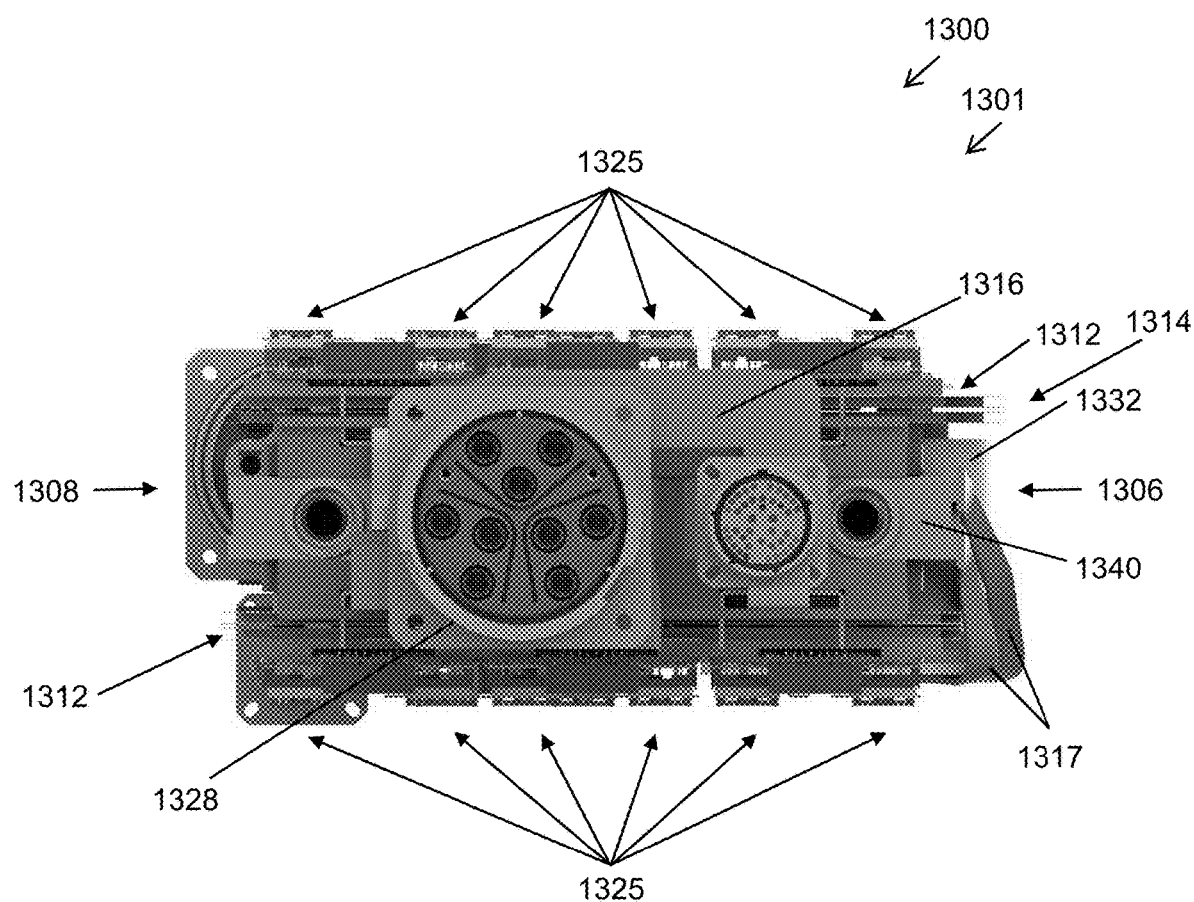
FIG. 18 illustrates an example backside view of the embodiment of the flow-through power inverter bus of FIG. 14.

One example of a flow-through power inverter bus 1300 is illustrated in example FIGS. 12-13. The flow-through power inverter bus 1300 is part of a power inverter 1301 that has a front side 1302, a backside 1304, a left side 1306, and a right side 1308. The flow-through power inverter bus 1300 has a first flow-through bus segment 1312, a second flow-through bus segment 1314, and at least one third flow-through bus segment 1316. In three phase AC power configurations, there would be three of these third flow through bus segments for each of the three phases, as understood by those of ordinary skill in the art. The first flow-through bus segment 1312 has a first end 1312A and a second end 1312B and transmits a first DC voltage. The second flow-through bus segment 1314 has a first end 1314A and a second end 1314B and transmits the second DC voltage. The third flow-through bus segment 1316 has a first end 1316A and a second end 1316B and transmits an AC voltage.

The first end 1312A of the first flow-through bus segment 1312 receives the first DC voltage from a direct current (DC) input connector 1326 and the first end 1314A of the second flow-through bus segment 1314 receives the second DC voltage from the DC input connector 1326. The second ends 1316B of the third flow-through bus segment 1316 delivers an alternating current (AC) from at least one AC to DC converter 1324 (formed with the first gate driver unites 1325 and the second SiC half-bridge units 1324, 1336) to an AC output connector 1328.

Two high power capacitors 1332 are mounted near the front side 1302 and the left side 1304 of the power inverter 1301 with a first terminal of the high power capacitors 1332 connected to the first flow-through bus segment 1312 and a second terminal of the high power capacitors 1332 connected to the second flow-through bus segment 1314. The first terminal may be at a higher DC voltage value than the second terminal. In some configurations, and as best seen in FIGS. 14-18, additional cooling may be added to the capacitors 1318. For example, copper "heat pipes" 1317 may be used to create thermal transfer (non-electrical) heat transfer in vapor tubes. The heat pipes 1317 can be purchased commercially and may be used similar to CPU heatsinks. These heat pipes 1317 transfer the heat energy from, for example, peltier coolers located under the capacitors 1332 to the one or more cold plates (not illustrated) that may be attached to the cold plate 1340.

One or more first gate driver units 1325 (to control SiC half-bridge units 1334, 1336) may be mounted on a top side of the first flow-through bus segment 1312 opposite the first SiC half-bridge unit 1334 on the bottom side of the first flow-through bus segment 1312. Note, in some configurations, that the SiC portion of the half-bridge units may act at least partially as a heatsink and transfer heat to a cooling plate 1340. The second end 1312B of the first flow-through bus segment 1312 is configured to connect to inputs of the one or more first gate driver unit(s) 1325. A cooling plate (cold-plate) 1340 may be attached to, or located near, the first SiC half-bridge unit 1334. In some embodiments, a second SiC half-bridge unit 1336 may, if desired, be located under the cold-plate cooling unit 1340 as illustrated. The first end 1314A of the second flow-through bus segment 1314 is connected to the low DC input voltage at the DC input connector 1326 and the second end 1314B of the second flow-through bus segment 1314 is configured to be connected to the SiC half-bridge units 1334, 1336. The short, compact design of the "flow-through" technology is indicated by example arrows "C" and "D" in FIGS. 12 and 13, respectively, wherein these arrows show that current flows right to left without loop backs or drastic turns when converting DC power to AC power. As understood by those of ordinary skill in the art, current flows in reverse of arrows "C" and "D" when the power inverter 1301 operates to convert AC power to DC power. The compact and short bus route lowers the impedance and inductance of the power path as well as lowers the typically required DC link capacitor stage size. This in turn improves thermal performance, serviceability, and significantly reduces production/assembly time.

The first end 1316A of the third segment 1316 of the flow-through bus is configured to connect to outputs of the twelve separate driver units 1325. Each first gate driver unit 1325 is configured to generate, at least a portion, of one of three phases of an AC signal to flow onto three separate phase segments of the third flow-through bus segment 1316. The seconds ends 1316B of the third segment 1316 are connected the AC output connector 1328.

Other embodiments of FIGS. 12 and 13 may have other useful features and/or components. For example, in some configurations, the flow-through bus 1300 may be configured to interact with the cooling plate 1340 configured to be liquid cooled. In other configurations, the first half bridge unit 1334 may form a partial heatsink. The flow-through bus may interact with the gate driver units 1325 and the half-bridge units 1334, 1336 to connect to a digital signal processor (DSP) and provide feedback to the DSP. A power inverter implementing the flow through busses 1312, 1314, 1316 of FIGS. 12-13 may be capable of 200 kW or more with power densities of 27 kW/liter or more at the power stage and 16 kW/L overall with connectors and enclosure included in a compact rectangular size.

Methods that can be implemented in accordance with the disclosed subject matter, may be at least partially implemented with reference to the following flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g. device, system, process, component, and so forth). Additionally, it should be further appreciated that in some embodiments the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 19:
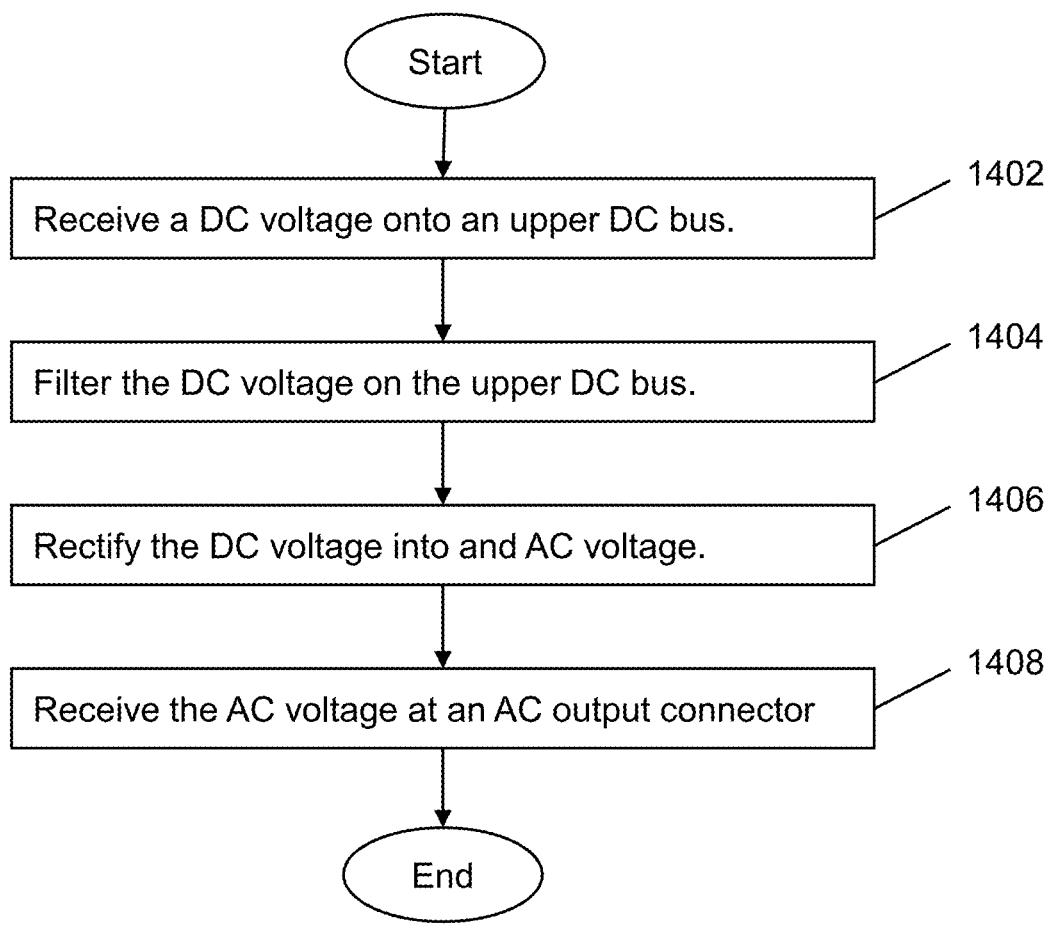
FIG. 19 illustrates an example view of a method of converting high power direct current (DC) to high power alternating current (AC).
Figure 20:
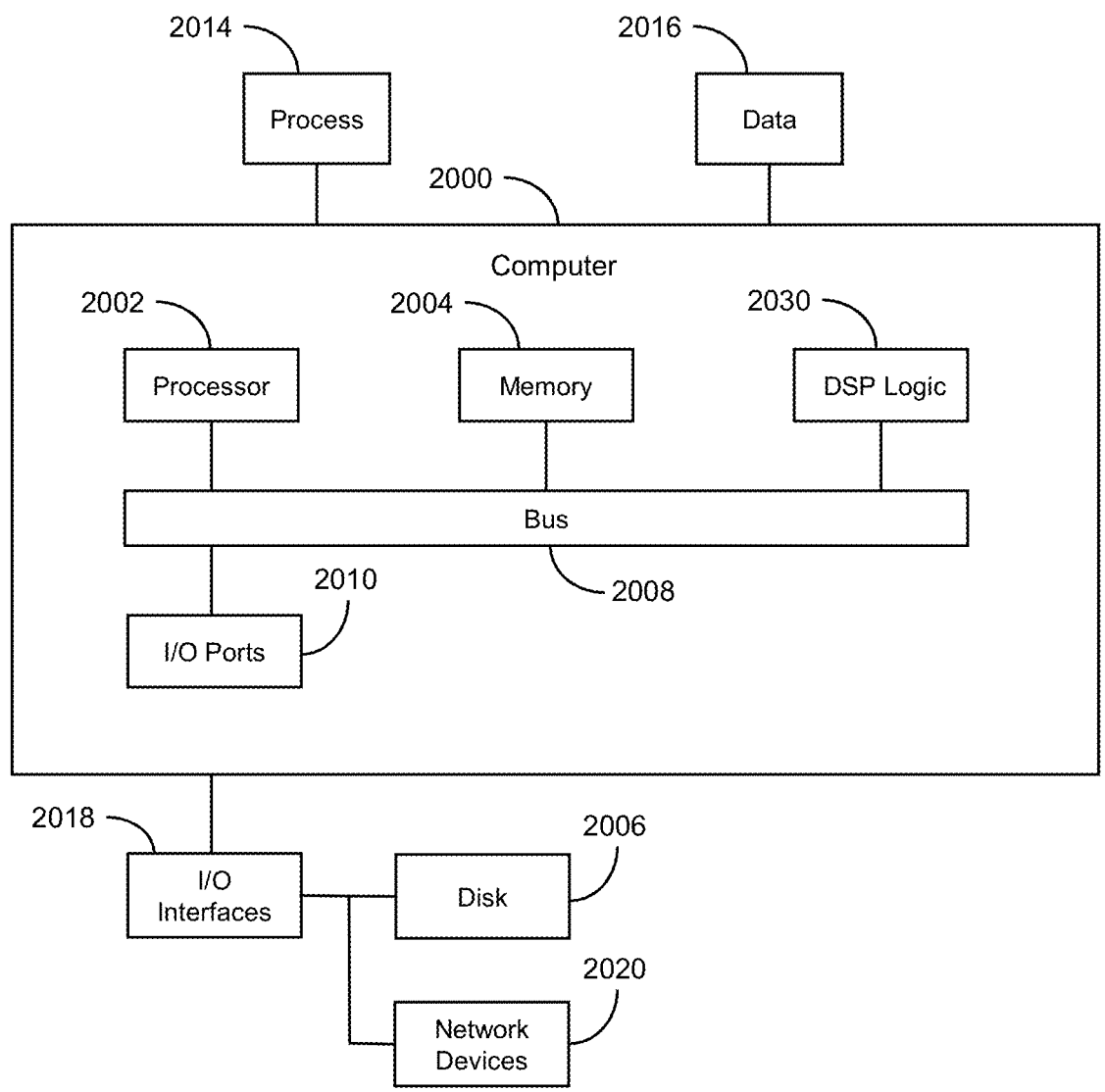
FIG. 20 illustrates an example view of an embodiment of a computer system.

Thus, various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments FIG. 19 illustrates some example actions of a method 1400 of converting high power direct current (DC) voltage to high power alternating current (AC). The method receives, at 1402, the DC voltage onto an upper DC bus. As discussed above, this may be a flow-through bus for very high-power transfer/low power loss on the bus. The DC voltage is filtered, at 1404, on the upper DC bus with capacitance to remove EMI. Other EMI or noise filtering may be performed as needed or desired. The AC voltage is generated, at 1406, by rectifying the DC voltage using DC to AC converters. As mentioned above, these converters may include half-bridges, Hall-effect sensors (as part of the half-bridges), drivers, and other components. In some configurations, the DC to AC converters may be cooled by pumping cooling liquid through a cold-plate adjacent the DC to AC converters. An AC output connector receives the AC voltage, at 1408. This AC voltage is ready to convert power or receive power one or more high power AC voltage devices such as electric machinery mounted to a truck that may include motor(s) and/or generator(s). As mentioned earlier, the power inverter 100 with silicon carbide (SiC) is currently capable of 200 kW or more in an ultra-compact arrangement, with power densities of up to 27 kW/L or more at the power stage and 16 kW/L overall with connectors and enclosure included. The method 1400 may provide for converting high DC current to High AC current with an inverter at a power of 200 kW or more in an ultra-compact arrangement with power densities of 27 kW/liter or more at the power stage and 16 kW/L overall with connectors and enclosure included within a small/compact rectangular shaped size with rectangular dimensions less than 301 mm×228 mm×110 mm FIG. 20 illustrates an example computing device in which example systems and methods described herein, and equivalents, may operate. The example computing device may be a computer 2000 that includes a processor 2002, a memory 2004, and input/output ports 2010 operably connected by a bus 2008. In one example, the computer 2000 may include a DSP logic 2030 configured to aid DC to AC converters in the formation of a high-power AC signal as described above. In different examples, the DSP logic 2030 may be implemented in hardware, software, firmware, and/or combinations thereof. Thus, the DSP logic 2030 may provide means (e.g., hardware, software, firmware) for implementing DSP types of operations. While the DSP logic 2030 is illustrated as a hardware component attached to the bus 2008, it is to be appreciated that in one example, the logic 2030 could be implemented in the processor 2002.

Generally describing an example configuration of the computer 2000, the processor 2002 may be a variety of various processors including dual microprocessor and other multi-processor architectures. The memory 2004 may include volatile memory and/or non-volatile memory. Non-volatile memory may include, for example, ROM, PROM, EPROM, and EEPROM. Volatile memory may include, for example, RAM; synchronous RAM (SRAM); dynamic RAM (DRAM), synchronous DRAM (SDRAM), double data rate SDRAM (DDR SDRAM), direct RAM bus RAM (DR RAM) and the like.

A disk 2006 may be operably connected to the computer 2000 via, for example, an input/output interface (e.g., card, device) 2018 and an input/output port 2010. The disk 2006 may be, for example, a magnetic disk drive, a solid state disk drive, a floppy disk drive, a tape drive, a Zip drive, a flash memory card, and/or a memory stick. Furthermore, the disk 2006 may be a CD-ROM, a CD recordable drive (CD-R drive), a CD rewriteable drive (CD-RW drive), and/or a digital video ROM drive (DVD ROM). The memory 2004 can store a process 2014 and/or a data 2016, for example. The disk 2006 and/or memory 2004 can store an operating system that controls and allocates resources of computer 2000.

The bus 2008 may be a single internal bus interconnect architecture and/or other bus or mesh architectures. While a single bus is illustrated, it is to be appreciated that the computer 2000 may communicate with various devices, logics, and peripherals using other busses (e.g., PCIE, SATA, Infiniband, 11384, Universal Serial Bus, Serial Peripheral Bus (SPI), Inter-Integrated Circuit Bus (I2C), Power Line Carrier bus, CAN bus, Ethernet). The bus 2008 can be types including, for example, a memory bus, a memory controller, a peripheral bus, an external bus, a crossbar switch, and/or a local bus.

The computer 2000 may interact with input/output devices via the input/output interfaces 2018 and the input/output ports 2010. Input/output devices may be, for example, a keyboard, a microphone, a pointing and selection device, cameras, video cards, displays, the disk 2006, the network devices 2020, and so on. The input/output ports 2010 may include, for example, serial ports, parallel ports, USB ports and the like.

The computer 2000 can operate in a network environment and thus may be connected to network devices 2020 via input/output interfaces 2018, and/or the input/output ports 2010. Through the network devices 2020, computer 2000 may interact with a network. Through the network, the computer 2000 may be logically connected to remote computers. Networks with which the computer 2000 may interact include, but are not limited to, Serial Peripheral Bus (SPI), Inter-Integrated Circuit Bus (I2C), a power line carrier bus (PLC), a controller area bus (CAN), a local area network (LAN), a wide area network (WAN), and other networks. The networks may be wired and/or wireless networks.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described, Thus, this application is intended to embrace alterations, modifications, and variations that fall within the scope of the appended claims. Accordingly, the disclosure is intended to embrace all such alterations, modifications, and variations that fall within the scope of this application, including the appended claims.

Moreover, the description and illustration of the invention is an example and the invention is not limited to the exact details shown or described. References to "the preferred embodiment", "an embodiment", "one example", "an example" and so on, indicate that the embodiment(s) or example(s) so described may include a particular feature, structure, characteristic, property, element, or limitation, but that not every embodiment or example necessarily includes that particular feature, structure, characteristic, property, element, or limitation. Additionally, references to "the preferred embodiment", "an embodiment", "one example", "an example" and the like, are not to be construed as preferred or advantageous over other embodiments or designs. Rather, use of the words "the preferred embodiment", "an embodiment", "one example", "an example" and the like are intended to present concepts in a concrete fashion.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

What is claimed is:

1. An inverter assembly comprising:
   a direct current (DC) connector on a front side of the inverter assembly, wherein the inverter assembly has the front side, a backside, a left side, and a right side;
   an upper DC bus connected to the DC connector;
   at least one capacitor mounted below the upper DC bus near a corner formed by the left side and front side of the inverter assembly, wherein the at least one capacitor is connected to the upper DC bus to filter a DC signal on the upper DC bus;
   a lower DC bus connected to the upper DC bus;
   a liquid cooled cold-plate cooling unit positioned between the upper DC bus and the lower DC bus;
   a first silicon carbide (SiC) half-bridge unit located between the upper DC bus and the cold-plate cooling unit;
   a second SiC half-bridge unit located between the lower DC bus and the cold-plate cooling unit;
   a first gate driver located on the upper DC bus above the first SiC half-bridge unit configured to, in combination with the first SiC half-bridge unit, convert a DC signal into an AC signal;
   a second gate driver located below the lower DC bus and below the second SiC half-bridge unit, wherein the second gate driver is configured to, in combination with the second half-bridge unit, convert the DC signal into the AC signal;
   an AC output connector on the backside of the inverter assembly; and
   at least one AC bus segment with a first end and a second end; wherein the first end is connected to the first SiC half-bridge unit and to the second SiC half-bridge unit, and wherein the second end of the AC bus segment is connected to the AC output connecter, wherein the AC output connector is configured to provide the AC signal as an output signal.

2. The inverter assembly of claim 1 wherein the first SiC half-bridge unit further comprises:
   two or more SiC half-bridge units, and wherein the second SiC half-bridge unit further comprises two or more SiC half-bridge units.

3. The inverter assembly of claim 1 further comprising:
a digital signal processor (DSP) configured to receive feedback from at least the first SiC half-bridge unit and to control the first gate driver and the first SiC half-bridge unit to produce the AC signal based, at least in part, on the feedback.

4. The inverter assembly of claim 1 wherein the inverter assembly is capable of 200 kW or more in an ultra-compact arrangement with power densities of 27 kW/liter or more at the power stage and 16 kW/L overall with connectors and enclosure included, and wherein, the inverter assembly is a rectangular box shape with dimensions of approximately 301 mm×228 mm×110 mm.

5. The inverter assembly of claim 1 wherein twelve upper gate driver units are located on the upper DC bus above one or more SiC half-bridge units, wherein twelve lower gate driver units are located below the lower DC bus below one or more SiC half-bridge units.

6. The inverter assembly of claim 1 wherein the first SiC half-bridge unit and the second SiC half-bridge unit each further comprise:
a Hall-effect sensor.

7. The inverter assembly of claim 1 wherein the at least one capacitor has a combined value of between 200 uF and 400 uF.

8. The inverter assembly of claim 1, wherein the AC signal is a three phase AC signal.

9. The inverter assembly of claim 1, wherein the first SiC half-bridge unit is attached to a top surface of the cooling plate.

10. The inverter assembly of claim 1, wherein the first SiC half-bridge unit is attached to a top surface of the cooling plate with an adhesive.

11. An inverter comprising:
an upper DC bus with a top surface and a bottom surface configured to receive a DC signal;
at least one large power capacitor configured to filter the DC signal;
a lower DC bus with a top surface and a bottom surface, wherein the lower DC bus is connected to the upper DC bus;
a cold-plate cooling unit with a top surface and a bottom surface;
a first SiC half-bridge unit with a top surface and a bottom surface;
a second SiC half-bridge unit with a top surface and a bottom surface;
a first gate driver unit; and
a second gate driver unit, wherein the top surface of the first SiC half-bridge unit is located beneath the bottom surface of the upper DC bus and above the top surface of the cold-plate cooling unit, wherein the second SiC half-bridge unit is located above the top surface of the lower DC bus and beneath the bottom surface of the cold-plate cooling unit, wherein the first driver unit is located above the top surface of the upper DC bus and above the top surface of the first SiC half-bridge unit; wherein the second driver unit is located under the bottom surface of the lower DC bus below the bottom surface of the second SiC half-bridge unit; and wherein the first half-bridge unit and the second half-bridge unit are configured to convert the DC signal into an AC signal.

12. The inverter of claim 11 wherein the cold-plate cooling unit is cooled by flowing coolant through the cold-plate cooling unit.

* * * * *